United States Patent
Choi et al.

(10) Patent No.: US 7,566,945 B2
(45) Date of Patent: Jul. 28, 2009

(54) SEMICONDUCTOR DEVICES INCLUDING NANOTUBES

(75) Inventors: Young-moon Choi, Seoul (KR); Sun-woo Lee, Metropolitan (KR)

(73) Assignee: Samsung Electronics Co., Ltd. (KR)

( * ) Notice: Subject to any disclaimer, the term of this patent is extended or adjusted under 35 U.S.C. 154(b) by 450 days.

(21) Appl. No.: 11/418,419

(22) Filed: May 4, 2006

(65) Prior Publication Data
US 2006/0249726 A1    Nov. 9, 2006

(30) Foreign Application Priority Data
May 7, 2005     (KR)  .................... 10-2005-0038223

(51) Int. Cl.
*H01L 29/00*     (2006.01)
(52) U.S. Cl. .................... 257/522; 257/211; 257/508; 257/513; 257/E33.062; 977/932; 977/940
(58) Field of Classification Search ................ 257/211, 257/503, 508, 513, 522; 977/932, 940
See application file for complete search history.

(56) References Cited

U.S. PATENT DOCUMENTS 6,440,763 B1     8/2002     Hsu

2003/0209802 A1*  11/2003  Awano .................... 257/712
2004/0219773 A1*  11/2004  Choi et al. ............... 438/597
2004/0253805 A1   12/2004  Dubin et al.
2006/0169972 A1*   8/2006  Furukawa et al. ......... 257/20
2006/0237799 A1*  10/2006  Lu et al. ................. 257/382

FOREIGN PATENT DOCUMENTS

| JP | 2004-146520 | 5/2004 |
| KR | 1020000050787 A | 8/2000 |
| KR | 1020040094065 | 11/2004 |

OTHER PUBLICATIONS

Korean Intellectual Property Office, "Notice to Submit Response" corresponding to Korean Patent Application No. 10-2005-0038223, mailed May 4, 2006.

* cited by examiner

*Primary Examiner*—Wai-Sing Louie
(74) *Attorney, Agent, or Firm*—Myers Bigel Sibley & Sajovec

(57) ABSTRACT

Nano semiconductor switch devices are provided that include a semiconductor substrate and a conductive layer on the semiconductor substrate. A first insulating layer is provided on the conductive layer and the semiconductor substrate. The first insulating layer defines a contact hole that exposes at least a portion of the conductive layer. Carbon nano tubes are provided on the exposed portion of the conductive layer in the contact hole. The carbon nano tubes are in a vertical direction with respect to the semiconductor substrate. Related methods of fabrication are also provided herein.

27 Claims, 19 Drawing Sheets

SEMICONDUCTOR DEVICES INCLUDING NANOTUBES

CLAIM OF PRIORITY

This application is related to and claims priority from Korean Patent Application No. 10-2005-0038223, filed on May 7, 2005, in the Korean Intellectual Property Office, the disclosure of which is hereby incorporated herein by reference as if set forth in its entirety.

FIELD OF THE INVENTION

The present invention relates to semiconductor memory devices, and more particularly, to nano semiconductor switch devices and methods of fabricating the same.

BACKGROUND OF THE INVENTION

Semiconductor memory devices, such as dynamic random access memories (DRAMs) and nonvolatile memories, store data, read stored data and/or erase stored data. A unit cell of a DRAM generally consists of one metal oxide semiconductor (MOS) transistor and one capacitor. As semiconductor memory devices become more highly integrated, the size of the memory device is scaled down and, therefore, the capacitor area is reduced. Thus, it may be difficult to obtain a sufficient capacitance.

SUMMARY OF THE INVENTION

Some embodiments of the present invention provide nano semiconductor switch devices including a semiconductor substrate and a conductive layer on the semiconductor substrate. A first insulating layer is provided on the conductive layer and the semiconductor substrate. The first insulating layer defines a contact hole that exposes at least a portion of the conductive layer. Carbon nano tubes are provided on the exposed portion of the conductive layer in the contact hole. The carbon nano tubes are in a vertical direction with respect to the semiconductor substrate.

In further embodiments of the present invention, the conductive layer may be a second conductive layer. A first conductive layer may be provided between the second conductive layer and the semiconductor substrate. A third conductive layer may be provided on the first insulating layer. The third conductive layer may include an air gap configured to electrically separate maintain the carbon nano tubes from the third conductive layer.

In still further embodiments of the present invention, the first conductive layer may include one or more metals selected from the group consisting of tungsten (W), titanium (Ti), tantalum (Ta), titanium nitride (TiN), tantalum nitride (TaN), aluminum (Al), and copper (Cu). The second conductive layer may include one ore more transition metals selected from the group consisting of nickel (Ni), iron (Fe), and cobalt (Co), or a silicide layer of a transition metal selected from the group consisting of Ni, Fe, and Co.

In some embodiments of the present invention, the second conductive layer may include a stacked layer of a low resistance metal layer and a transition metal layer. The low resistance metal layer may include one or more low resistance metals selected from the group consisting of W, Cu, Al, Ti, TiN, Ta, and TaN and the transition metal layer may include one or more transition metals selected from the group consisting of Ni, Fe, and Co.

In further embodiments of the present invention, the air gap may include a gap of from about several nanometers to about several tens of nanometers between the carbon nano tubes and the third conductive layer.

In still further embodiments of the present invention, the third conductive layer may include at least one metal selected from the group consisting of doped polysilicon, W, Ti, TiN, Ta, TaN, Cu, Al, platinum (Pt), palladium (Pd), and aurum (Au).

In some embodiments of the present invention, the device further includes a second insulating layer on the third conductive layer and the carbon nano tubes in the contact hole so as to protect the carbon nano tubes. A third insulating layer may be provided between the third conductive layer and the second insulating layer, the contact hole being formed over the first insulating layer and the third insulating layer.

Although embodiments of the present invention are discussed above with respect to device embodiments, method embodiments of the present invention are also provided herein.

DETAILED DESCRIPTION OF EMBODIMENTS OF THE PRESENT INVENTION

Figure 1A:
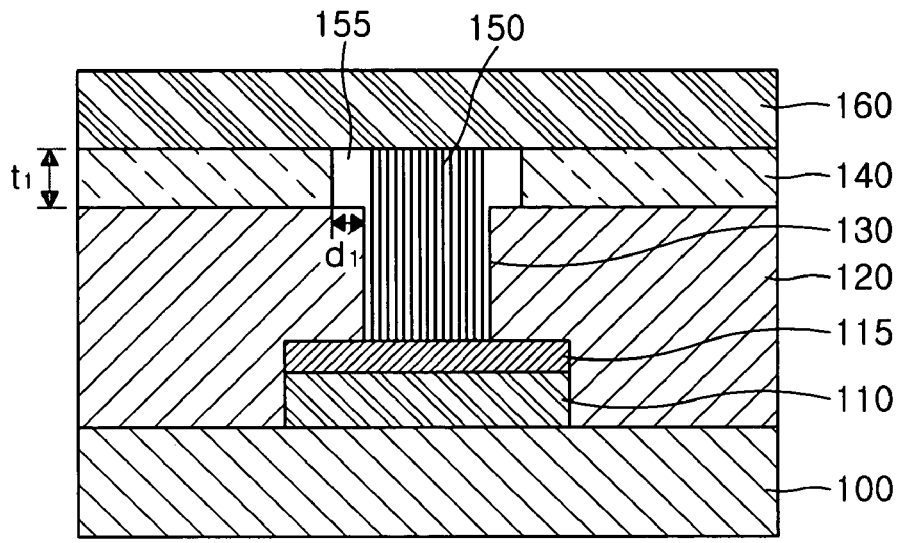
FIG. 1A is a cross section illustrating nano semiconductor switch devices using an electromechanism of a carbon nano tube according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
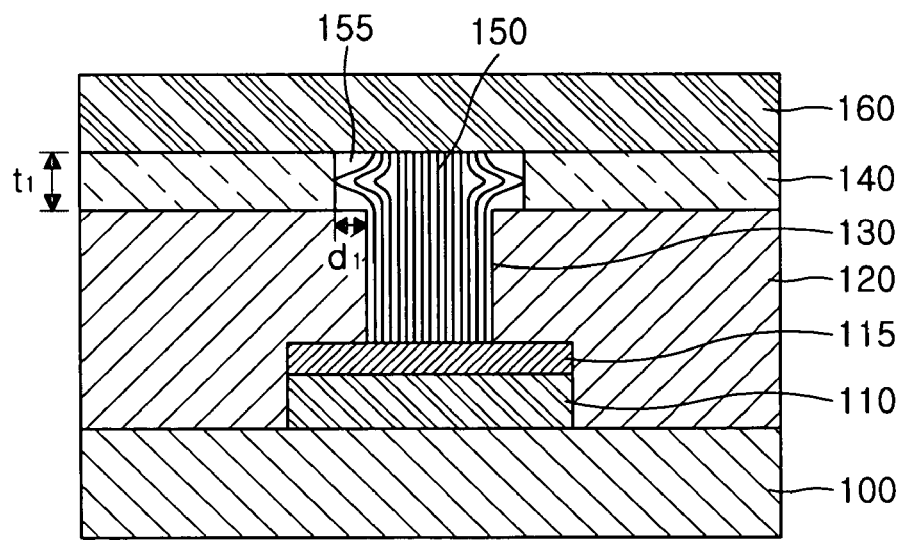
FIG. 1B is a cross section illustrating a switching operation of nano semiconductor switch devices illustrated in FIG. 1A according to some embodiments of the present invention.

FIGS. 1A and 1B are cross sections illustrating nano semiconductor switch devices using a carbon nano tube according to some embodiments of the present invention. In particular, FIG. 1A is a cross section of the nano semiconductor switch device that is in a switched-off state, and FIG. 1B is a cross section of the nano semiconductor switch device that is in a switched-on state. Furthermore, FIG. 1C is an equivalent circuit diagram of the nano semiconductor switch devices illustrated in FIGS. 1A and 1B.

Figure 1C:
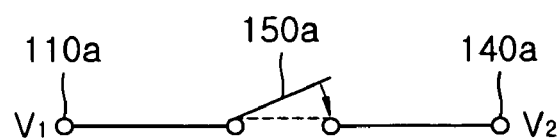
FIG. 1C is an equivalent circuit diagram of nano semiconductor switch devices illustrated in FIG. 1A according to some embodiments of the present invention.

Referring to FIGS. 1A, 1B and 1C, the nano semiconductor switch device includes a first node 110a, a second node 140a, and a contact 150a. The contact is electrically configured to switch on/off the first node 110a and the second node 140a. A first conductive layer 110 for the first node 110a is provided on a semiconductor substrate 100, and a catalyst layer 115 is provided on the first conductive layer 110. Although the first conductive layer 110 is patterned, it will be understood that the present invention is not limited to this patterned structure. For example, the first conductive layer 110 may be formed on the surface of the semiconductor substrate. Furthermore, although the catalyst layer 115 is formed on the first conductive layer 110, the catalyst layer 115 can also be provided only on the first conductive layer 110 within the contact hole 130.

The conductive layer 110 may include one or more of tungsten (W), titanium (Ti), tantalum (Ta), titanium nitride (TiN), tantalum nitride (TaN), aluminum (Al) and copper (Cu). The catalyst layer 115 may include one or more transition metal layers including nickel (Ni), iron (Fe), and cobalt (Co), or a silicide layer of a transition metal including Ni, Fe, and Co. In addition, the catalyst layer 115 may include a low resistance metal layer on the conductive layer 110 and a transition metal layer on the low resistance metal layer. The low resistance metal layer may include one or more of W, Ti, Ta, Cu, Al, TiN, and TaN, and the transition metal layer may include one or more of Ni, Fe, and Co.

A first insulating layer 120 is provided on the first conductive layer 110. The first insulating layer 120 includes a contact hole 130 that exposes at least a portion of the catalyst layer 115. A second conductive layer 140 is provided for the second node 140a on the first insulating layer 120. In some embodiments of the present invention, the second conductive layer 140 may include a material having a different etch selectivity from that of the first insulating layer 120 and the catalyst layer 115. The second conductive layer 140 for the second node 140a may include one or more of W, Ti, TiN, Ta, TaN, Cu, Al, platinum (Pt), palladium (Pd), and aurum (Au), or a doped polysilicon layer.

As the contact 150a for contacting the first node 110a and the second 140a, carbon nano tubes (CNTs) 150 are provided on the catalyst layer 115 within the contact hole 130 in a vertical direction with respect to the surface of semiconductor substrate 100. When the second conductive layer 140 for the second node 140a is provided on the first insulating layer 120, it maintains a predetermined distance d1 from an edge of the contact hole 130. Accordingly, the second conductive layer 140 includes an air gap 155 that electrically separates the second conductive layer 140 from the carbon nano tubes 150. A thickness t1 and a depth d1 of the air gap 155 depend on a diameter of the carbon nano tubes 150 and an operating speed and operating voltage of the switch device. The thickness t1 and the depth d1 of the air gap 155 can be from about several nano meters to several tens of nano meters. A second insulating layer 160 for protecting the carbon nano tubes 150 is provided on the second conductive layer 140 and the carbon nano tubes 150 within the contact hole 130.

In the nano semiconductor switch device with the above-described structure, as illustrated in FIG. 1B, when predetermined voltages of different polarities are applied to the first conductive layer 110 and the second conductive layer 140, the carbon nano tubes 150 contact the second conductive layer 140 by electrical attraction between the first conductive layer 110 and the second conductive layer 140. The first conductive layer 110 and the second conductive layer 140 are electrically connected and maintain a switched-on state (which is indicated by a dotted line in FIG. 1C). Furthermore, as illustrated in FIG. 1A, when predetermined voltages with the same polarity are applied to the first conductive layer 110 and the second conductive layer 140, the carbon nano tubes 150 are separated from the second conductive layer 140 by electrostatic repulsive force, and the carbon nano tubes 150 are restored to the initial state and maintains a switched-off state (which is indicated by a solid line in FIG. 1C). Accordingly, the carbon nano tubes 150 electrically switch on/off two conductive layers 110 and 140, with the first insulating layer 120 being interposed therebetween, by electromechanical force.

Figure 2A:
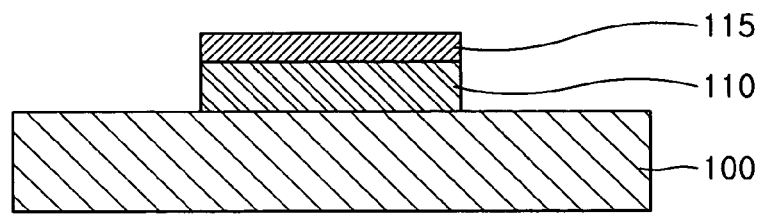
FIGS. 2A through 2E are cross sections illustrating processing steps in the fabrication of nano semiconductor switch devices according to some embodiments of the present invention.

Referring now to FIGS. 2A through 2E, cross sections illustrating processing steps in the fabrication of nano semiconductor switch devices according to some embodiments of the present invention will be discussed. As illustrated in FIG. 2A, a metal layer is deposited on a semiconductor substrate 100 by a physical vapor deposition (PVD) or a chemical vapor deposition (CVD), and is patterned to form a first conductive layer 110. The first conductive layer 110 may include one or more metal layers including W, Ti, Ta, TiN, TaN, Al and Cu. A catalyst layer 115 is self-aligned on the first conductive layer 110. The catalyst layer 115 may include one or more transition metal layers including Ni, Fe, and Co, or one or more silicide layers of transition metals including Ni, Fe, and Co. Furthermore, the catalyst layer 115 may include a stacked layer of a low resistance metal layer and a transition metal layer. The low resistance metal layer may include one or more metals including W, Ti, Ta, Cu, Al, TiN, and TaN, and the transition metal layer may include one or more metals including Ni, Fe, and Co. Although not illustrated in FIGS. 2A through 2E, an etch stop layer may be formed between the first conductive layer 110 and the semiconductor substrate 100.

According to some embodiments of the present invention, the first conductive layer 110 and the catalyst layer 115, a metal layer and a transition metal layer may be sequentially formed on the semiconductor substrate 100 by a CVD or PVD process, or by a codeposition process, and then patterned. The catalyst layer 115 is etched using a plasma gas containing chlorine (Cl). The catalyst layer 115 can also be formed by spin-coating nano particles. In further embodiments of the present invention, the first conductive layer 110 can be formed by forming a doped polysilicon layer, and the catalyst layer 115 may include a metal silicide layer. The doped polysilicon layer is formed and patterned, and a silicide process is performed on the doped polysilicon layer in a self-align process. A silicide layer of transition metal, such as Ni, Fe or Co, can be formed. Furthermore, after the doped polysilicon layer and the transition metal layer, a silicide process may be performed to form a transition metal silicide layer and the transition metal silicide layer may be patterned.

Figure 2B:
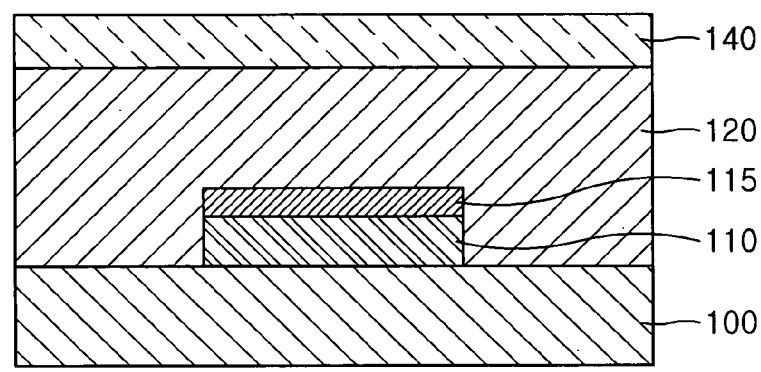

Referring now to FIG. 2B, a first insulating layer 120 is formed on the semiconductor substrate 100 and a second conductive layer 140 is formed on the first insulating layer 120 using, for example, a PVD or CVD process. In some embodiments of the present invention, the second conductive layer 140 may include a material with a different etch selectivity from the catalyst layer 115 and the first insulating layer 120. The second conductive layer 140 includes one or more metal layers including W, Ti, TiN, Ta, TaN, Cu, Al, Pt, Pd, and Au. The second conductive layer 140 can be formed using, for example, spin-coating or dipping compounds containing carbon nano tubes.

Figure 2C:
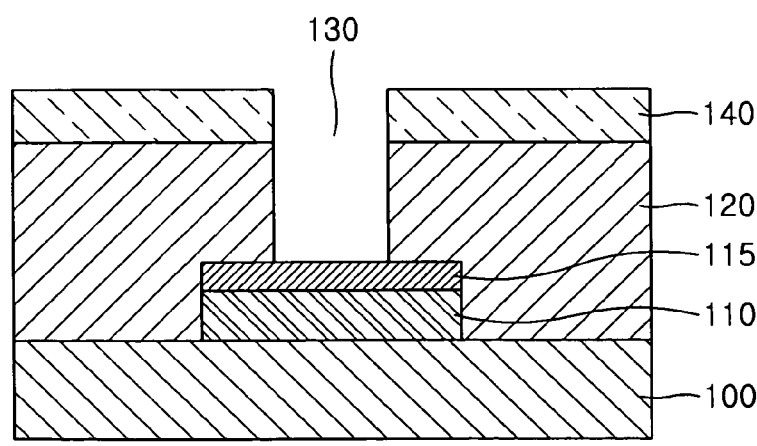

Referring now to FIG. 2C, the first insulating layer 120 and the second conductive layer 140 are etched using, for example, an anisotropic etching process to form a contact hole 130 exposing a portion of the catalyst layer 115. In some embodiments of the present invention, after the contact hole 130 exposing a portion of the first conductive layer 10 is formed, the catalyst layer 115 can be formed only on the conductive layer 110 exposed by the contact hole 130. The catalyst layer 115 can be formed by forming a transition metal layer using a PVD process or can be formed by selectively coating a catalyst solution containing a transition metal.

Figure 2D:
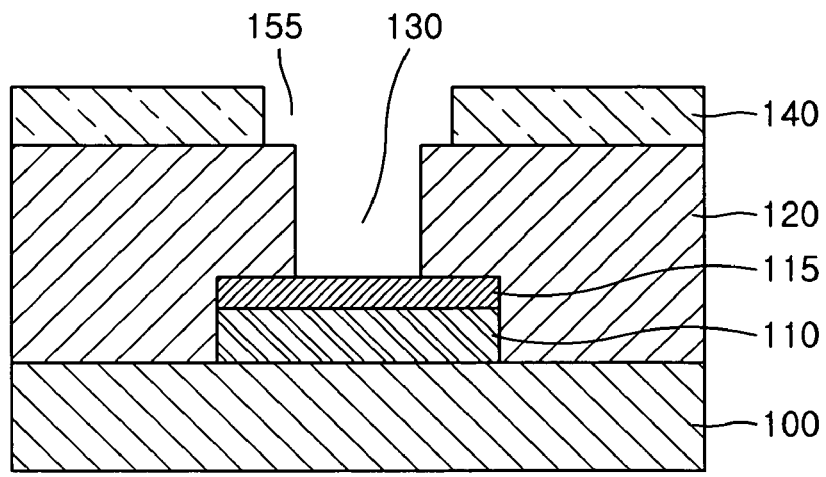

Referring now to FIG. 2D, the second conductive layer 140 is undercut to form an air gap 155. The second conductive layer 140, with a different etch selectivity from the first insulating layer 120 and the catalyst layer 115, is etched using, for example, an isotropic etching process. Due to the air gap 155, the second conductive layer 140 is spaced apart from an edge of the contact hole 130 by, for example, a distance of from about several nanometers to about several tens nanometers. In some embodiments of the present invention, after the contact hole 130 and the air gap 155 are formed, the catalyst layer 115 can be formed only on the first conductive layer 110 exposed by the contact hole 130. The catalyst layer 115 can be formed by depositing a transition metal using a PVD process, or can be formed by selectively coating a catalyst solution containing a transition metal.

Figure 2E:
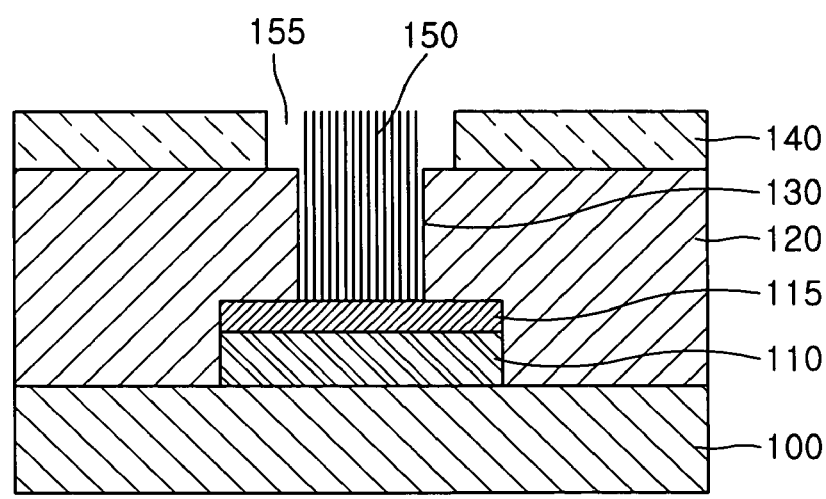

Referring now to FIG. 2E, under conditions of from about 500 to about 900° C., 500 sccm, and several to hundreds torr, carbon nano tubes 150 are formed by, for example, injecting a carbon-containing gas, such as CH4, C2H2, C2H4, C2H6, CO, or CO2, and a carrier gas, such as H2, Ar, or N2. The carbon nano tubes 150 are formed on the catalyst layer 115 within the contact hole 130 in a vertical direction with respect to the surface of the semiconductor substrate 100. The carbon nano tubes 150 are electrically separated from the second conductive layer 140 by the air gap 155. Lengths of the carbon nano tubes 150 are determined by their growth time. The carbon nano tubes 150 are grown from about several to about several tens of minutes. Diameters of the carbon nano tubes 150 range from about 1.0 nm to about 50.0 nm. A growth density of the carbon nano tubes 150 can be adjusted according to a thickness of the catalyst layer 115. A second insulating layer 160 is formed on the second conductive layer 140 and the carbon nano tubes 150 so as to protect the carbon nano tubes 150. Thus, the fabrication of the nano semiconductor switch device of FIG. 1A may be completed.

Figure 3A:
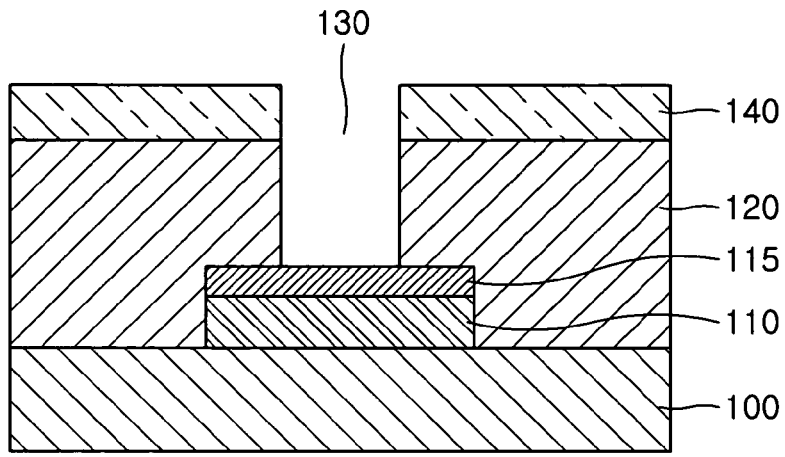
FIGS. 3A through 3C are cross sections illustrating processing steps in the fabrication of nano semiconductor switch devices according to further embodiments of the present invention.
Figure 3B:
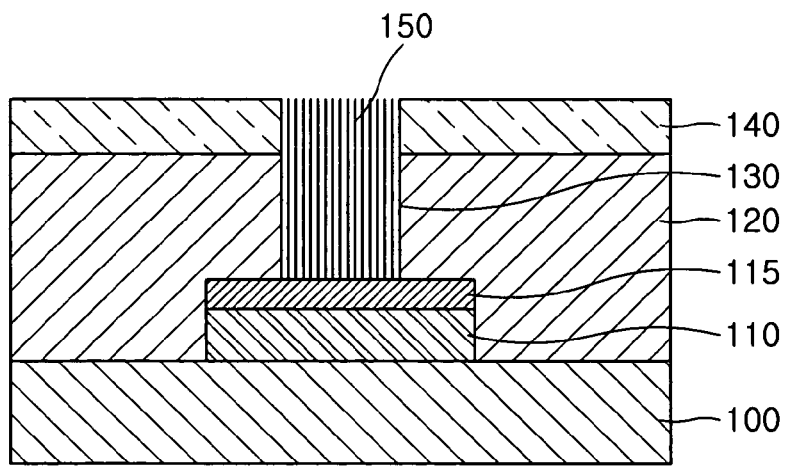
Figure 3C:
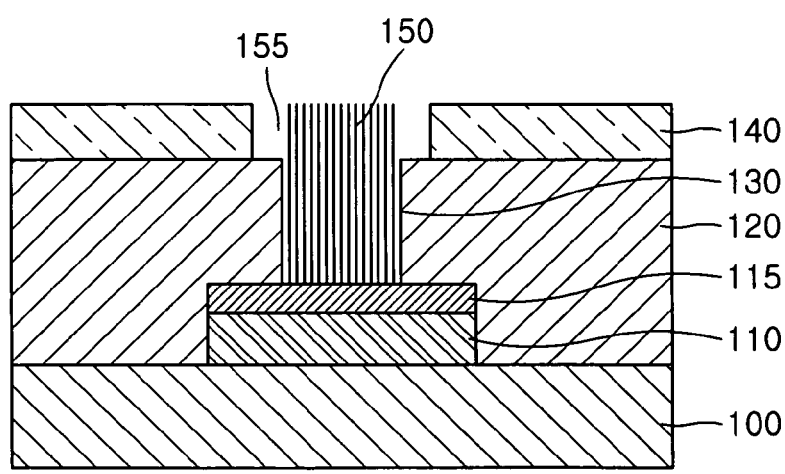

Referring now to FIGS. 3A through 3C, cross sections illustrating processing steps in the fabrication of nano semiconductor switch devices according to further embodiments of the present invention will be discussed. Referring first to FIGS. 3A and 3B, a contact hole 130 is formed on a first insulating layer 120, and carbon nano tubes 150 are formed on a catalyst layer 115 within the contact hole 130 in a vertical direction with respect to a semiconductor substrate 100. As illustrate in FIG. 3C, a second conductive layer 140 is undercut to form an air gap 155. The air gap 155 electrically separates the carbon nano tubes 150 from the second conductive layer 140. Thus, embodiments of the present invention illustrated in FIGS. 3A through 3C, reverse the order of the operation of forming the carbon nano tubes and the operation of forming the air gap as compared to embodiments discussed above with respect to FIGS. 2A through 2E. Accordingly, details with respect to these processing steps will not be repeated herein in the interest of brevity.

Figure 4A:
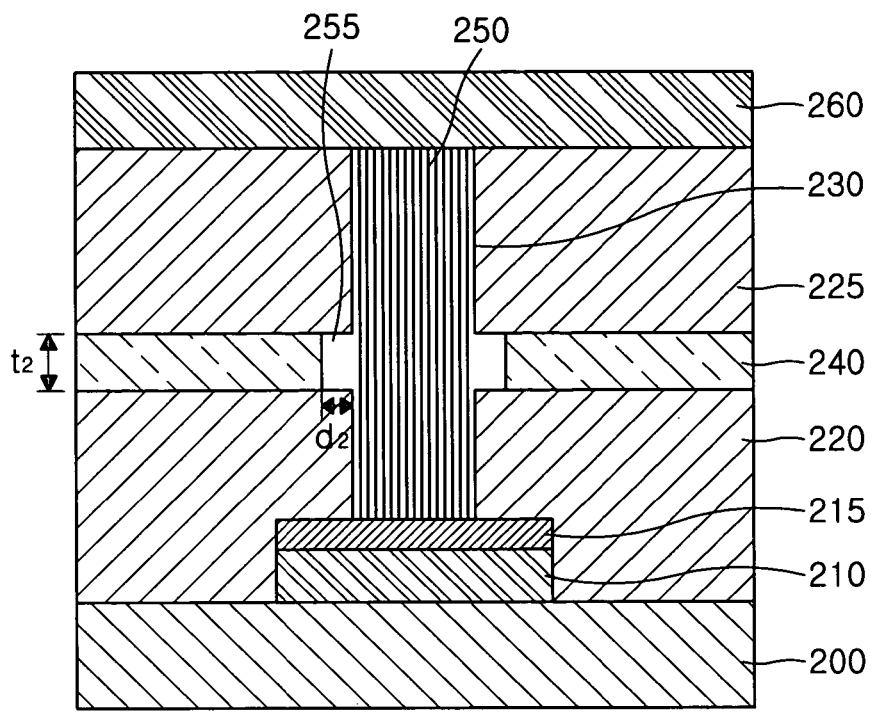
FIG. 4A is a cross section illustrating nano semiconductor switch devices using an electromechanism of a carbon nano tube according to further embodiments of the present invention.
Figure 4B:
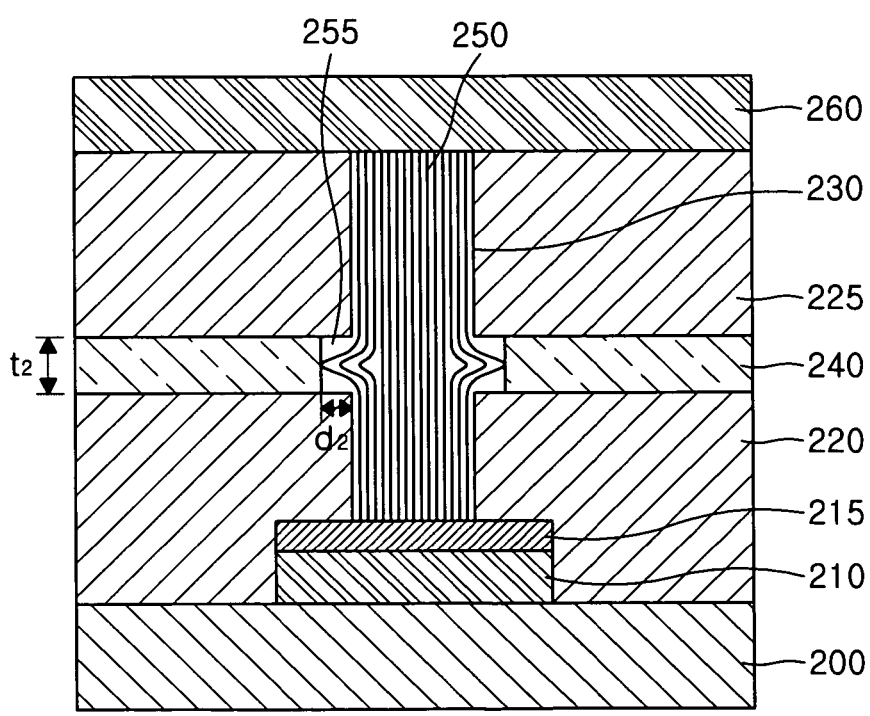
FIG. 4B is a cross section illustrating a switching operation of nano semiconductor switch devices illustrated in FIG. 4A according to some embodiments of the present invention.

FIGS. 4A and 4B are cross sections illustrating nano semiconductor switch devices using a carbon nano tube according to further embodiments of the present invention. In particular, FIG. 4A is a cross section illustrating the nano semiconductor switch device that is in a switched-off state, and FIG. 4B is a cross section of the nano semiconductor switch device that is in a switched-on state. FIG. 1C is an equivalent circuit diagram for the nano semiconductor switch devices illustrated in FIGS. 4A and 4B.

Referring now to FIGS. 4A and 4B, the nano semiconductor switch device includes a first node 110a, a second node 140a, and a contact 150a configured to electrically switch on/off the first node 110a and the second node 140a. A first conductive layer 210 for the first node 110a is formed on a semiconductor substrate 200, and a catalyst layer 215 is formed on the first conductive layer 210. A first insulating layer 220 and a second insulating layer 225 are formed on the first conductive layer 210 and the semiconductor substrate 200. The first insulating layer 220 and the second insulating layer 225 include a contact hole 230 exposing at least a portion of the catalyst layer 215. A second conductive layer 240 for the second node 140a is formed between the first insulating layer 220 and the second insulating layer 225.

As the contact 150a for contacting the first node 110a and the second node 140a, carbon nano tubes 250 are grown on the catalyst layer 215 within the contact hole 230 in a vertical direction with respect to the surface of the semiconductor substrate 200. A third insulating layer 260 for protecting the carbon nano tubes 250 is formed on the second insulating layer 225 and the carbon nano tubes 250. When the second conductive layer 240 for the second node 140a is formed between the first insulating layer 220 and the second insulating layer 225, it maintains a predetermined distance d2 from an edge of the contact hole 230. Accordingly, an air gap 255 is formed to electrically isolate the second conductive layer 240 from the carbon nano tubes 250. In some embodiments of the present invention, a thickness t2 and a depth d2 of the air gap 255 depend on a diameter of the carbon nano tubes 250 and an operating speed and voltage of the switch device. The thickness t2 and the depth d2 of the air gap 255 may range from about several nano meters to about several tens of nano meters.

Like reference numerals refer to like elements throughout the specification. Accordingly, as many of the layers of the nano semiconductor switch device according to the embodiments of the present invention illustrated in FIG. 4A and FIG. 4B are similar to those discussed above the details will not be repeated herein in the interest of brevity.

Figure 5A:
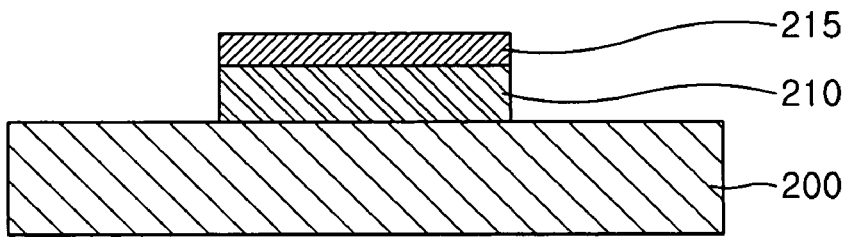
FIGS. 5A through 5E are cross sections illustrating processing steps in the fabrication of nano semiconductor switch devices according to the some embodiments of the present invention.

Referring now to FIGS. 5A through 5E, cross sections illustrating processing steps in the fabrication of nano semiconductor switch devices according to some embodiments of the present invention. As illustrated in FIG. 5A, a metal layer is formed on a semiconductor substrate 200 using, for example, a PVD or CVD process, and is patterned to form a first conductive layer 210. The first conductive layer 210 includes one or more metal layers including W, Ti, Ta, TiN, TaN, Al and/or Cu. A catalyst layer 215 is self-aligned on the first conductive layer 210. The catalyst layer 215 includes one or more transition metal layers including Ni, Fe, and Co, or one or more silicide layers of transition metals including Ni, Fe, and Co. Furthermore, the catalyst layer 215 can include a stacked layer of a low resistance metal layer and a transition metal layer. The low resistance metal layer may include one or more of W, Ti, Ta, Cu, Al, TiN, TaN, and BM, and the transition metal layer may include one or more of Ni, Fe, and Co. Although not illustrated in FIGS. 5A through 5E, an etch stop layer can be formed between the first conductive layer 210 and the semiconductor substrate 200.

The first conductive layer 210 and the catalyst layer 215 can be formed by, for example, sequentially depositing a metal layer and a transition metal layer on the semiconductor substrate 200 using, for example, a CVD or PVD process, or by a codeposition process, and patterning them. In some embodiments of the present invention, the catalyst layer 215 may be etched using, for example, a plasma gas containing chlorine (Cl). The first conductive layer 210 may include a doped polysilicon layer, and the catalyst layer 215 may include a metal silicide layer.

Figure 5B:
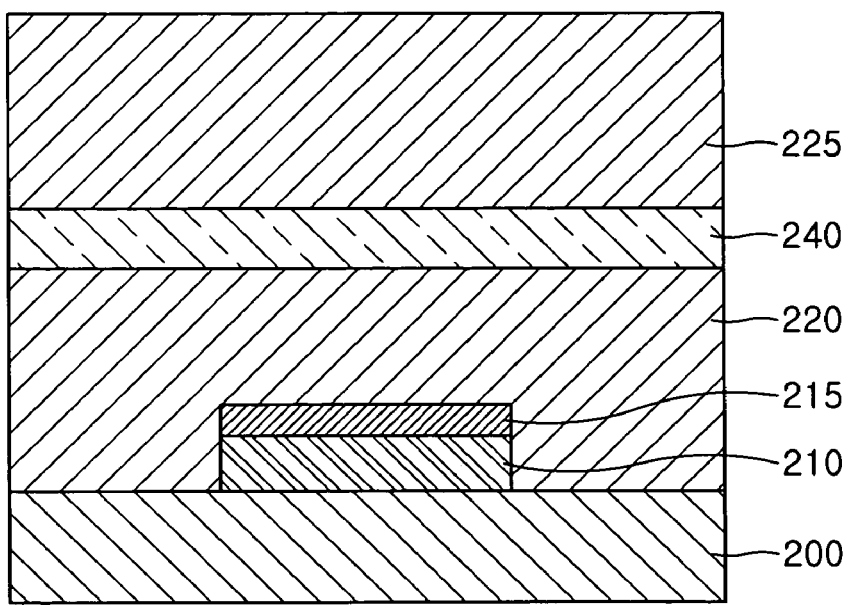

Referring now to FIG. 5B, a first insulating layer 220, a second conductive layer 240, and a second insulating layer 225 are formed on the semiconductor substrate 200. The second conductive layer 240 is formed on the first insulating layer 220 using, for example, a PVD or CVD process. In some embodiments of the present invention, the second conductive layer 240 may include a material with a different etch selectivity from the catalyst layer 215 and the first insulating layer 220. The second conductive layer 240 may include one or more metal layers including W, Ti, TiN, Ta, TaN, Cu, Al, Pt, Pd, and/or Au. The second conductive layer 240 may be formed by, for example, spin coating and/or dipping compounds containing carbon nano tubes.

Figure 5C:
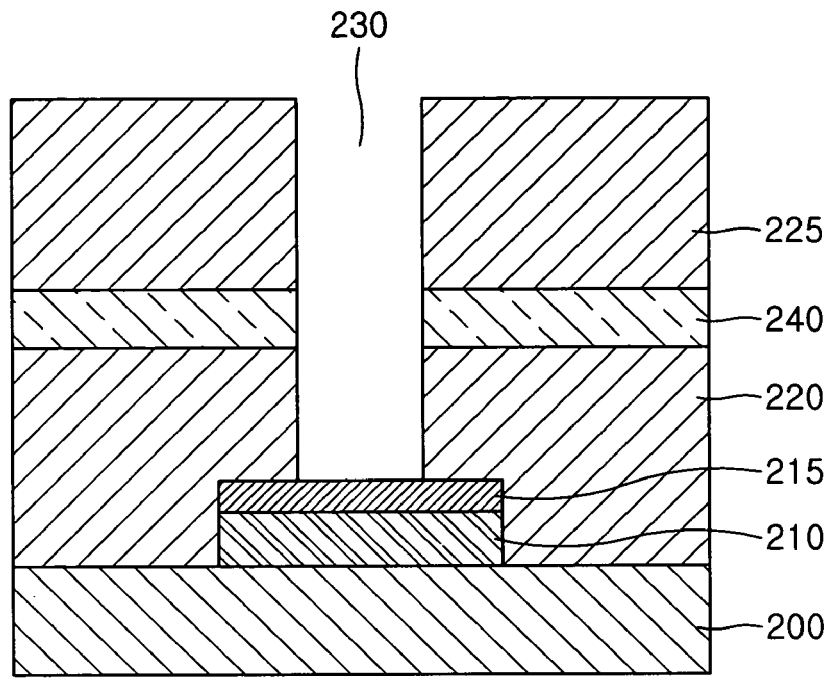

Referring now to FIG. 5C, the first insulating layer 220, the second conductive layer 240, and the second insulating layer 225 are etched using, for example, an anisotropic etching process, to form a contact hole 230 exposing at least a portion of the catalyst layer 215 in the first insulating layer 220 and the second insulating layer 225. In certain embodiments of the present invention, after the contact hole 230 exposing a portion of the first conductive layer 20 is formed, the catalyst layer 215 can be formed only on the first conductive layer 210 exposed within the contact hole 230. In these embodiments of the present invention, the catalyst layer 215 can be formed by depositing transition metal using a PVD process, or can be formed by selectively coating a catalyst solution containing transition metal.

Figure 5D:
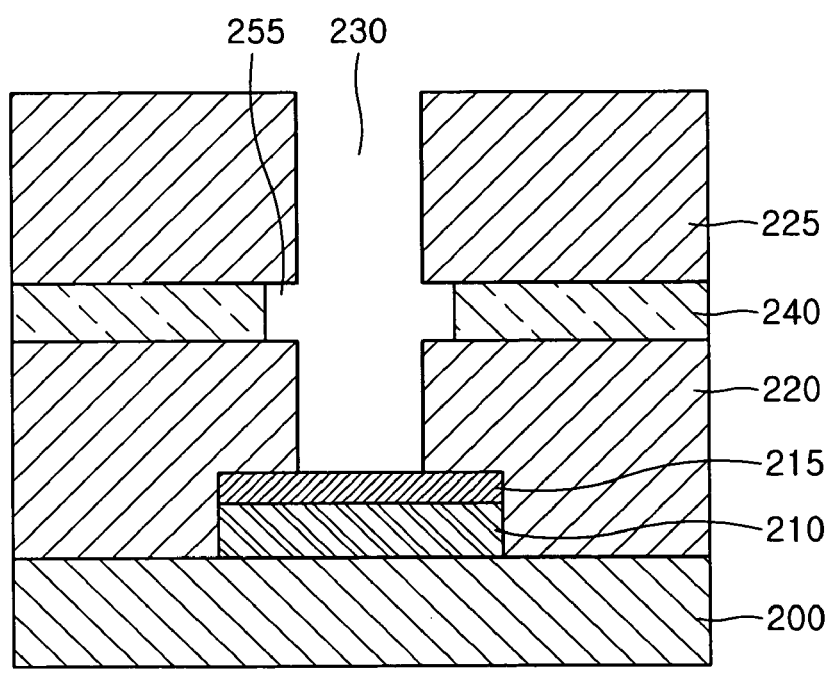

Referring now to FIG. 5D, the second conductive layer 240 may be undercut to form an air gap 255. The second conductive layer 240, having a different etch selectivity from the first insulating layer 220, the second insulating layer 225 and the catalyst layer 215, is etched using an isotropic etching process. Due to the air gap 255, the second conductive layer 240 is spaced apart from an edge of the contact hole 230, for example, a distance of from about several nanometers to about several tens of nanometers. In further embodiments of the present invention, after the contact hole 230 and the air gap 255 are formed, the catalyst layer 215 can be formed only on the first conductive layer 210 exposed within the contact hole 230. In these embodiments of the present invention, the catalyst layer 215 can be formed by depositing transition metal using a PVD process, or can be formed by selectively coating a catalyst solution containing transition metal.

Figure 5E:
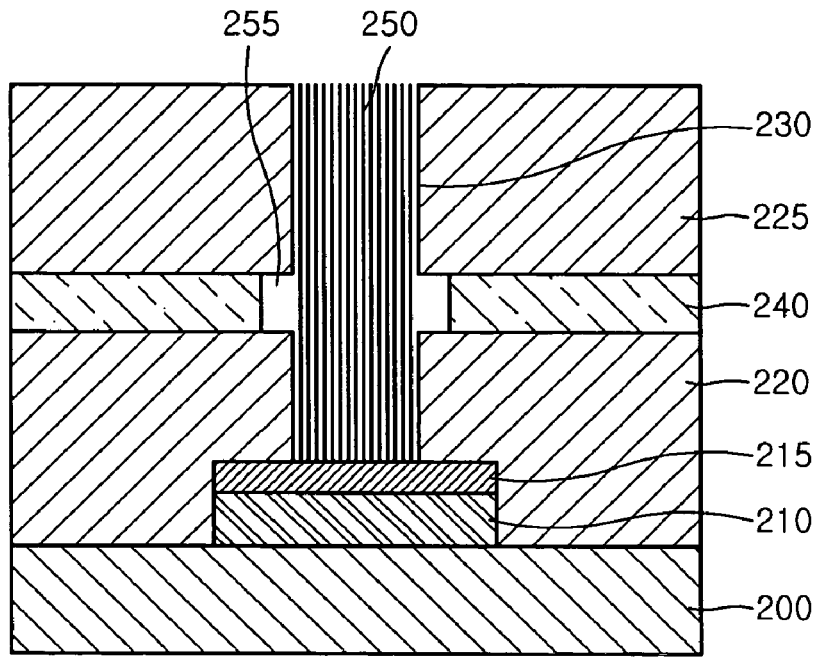

Referring now to FIG. 5E, under conditions of from about 500 to about 900° C., 500 sccm, and several to hundreds of torr, carbon nano tubes 150 are grown by injecting a carbon-containing gas, such as $CH_4$, $C_2H_2$, $C_2H_4$, $C_2H_6$, CO, or $CO_2$ and a carrier gas, such as $H_2$, Ar, or $N_2$. The carbon nano tubes 150 are grown on the catalyst layer 215 within the contact hole 230 in a vertical direction with respect to the surface of the semiconductor substrate 200. The carbon nano tubes 250 are electrically isolated from the second conductive layer 240 by the air gap 255. Lengths of the carbon nano tubes 250 may be determined by their growth time. The carbon nano tubes 250 are grown for from about several to about several tens of minutes. Diameters of the carbon nano tubes 250 range from about 1.0 nm to about 50.0 nm. A growth density of the carbon nano tubes 250 can be adjusted according to a thickness of the catalyst layer 215. A third insulating layer 260 is formed on the second conductive layer 240 and the carbon nano tubes 250 so as to protect the carbon nano tubes 250.

Figure 6A:
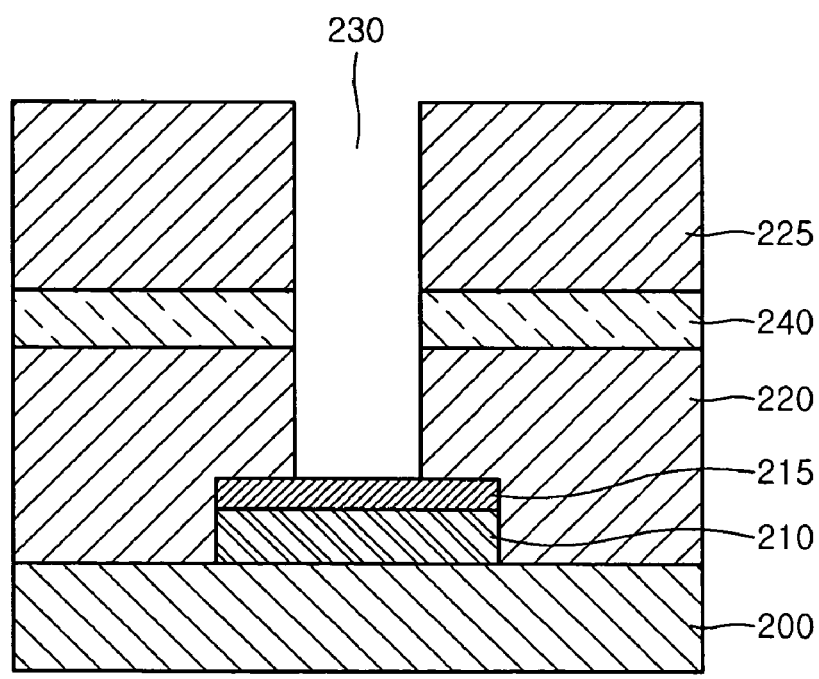
FIGS. 6A through 6C are cross sections illustrating processing steps in the fabrication of nano semiconductor switch devices according to further embodiments of the present invention.
Figure 6B:
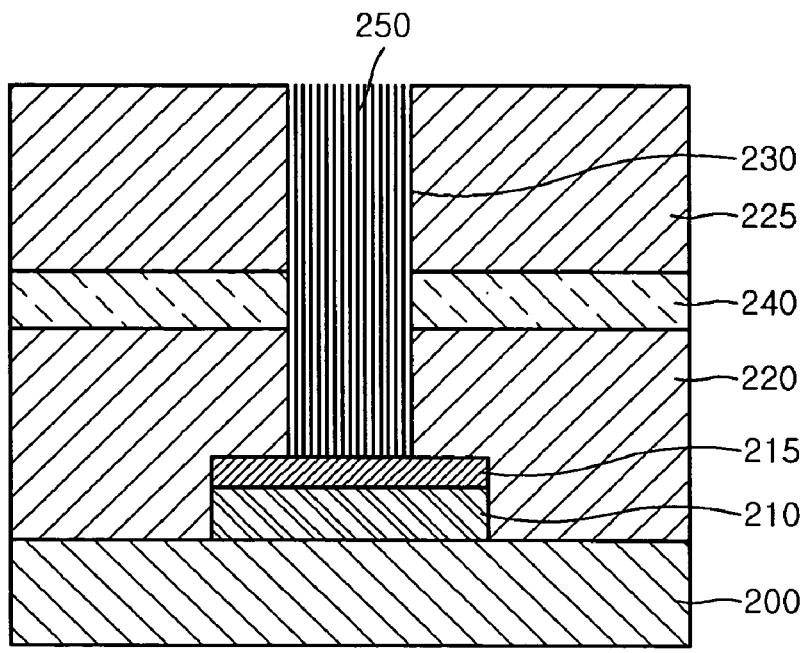
Figure 6C:
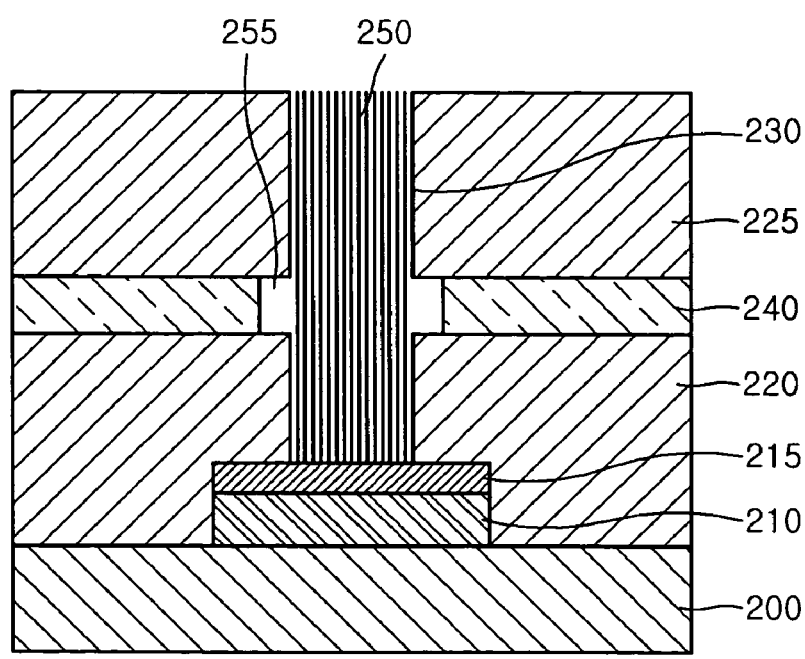

Referring now to FIGS. 6A through 6C, cross sections illustrating processing steps in the fabrication of nano semiconductor switch devices according to some embodiments of the present invention will be discussed. Referring first to FIGS. 6A through 6B, a contact hole 230 is formed on a first insulating layer 220 and a second insulating layer 225, and carbon nano tubes 250 are grown on a catalyst layer 215 within the contact hole 230 in a vertical direction with respect to a semiconductor substrate 200. Referring now to FIG. 6C, a second conductive layer 240 is undercut to form an air gap 255. The air gap 255 electrically separates the carbon nano tubes 250 from the second conductive layer 240. In comparison with the method illustrated in FIGS. 5A through 5E, embodiments of the present invention illustrated in FIGS. 6A through 6C reverse the order of the operation of forming the carbon nano tubes and the operation of forming the air gap. Thus, details with respect to these processing steps will not be repeated herein in the interest of brevity.

Figure 7:
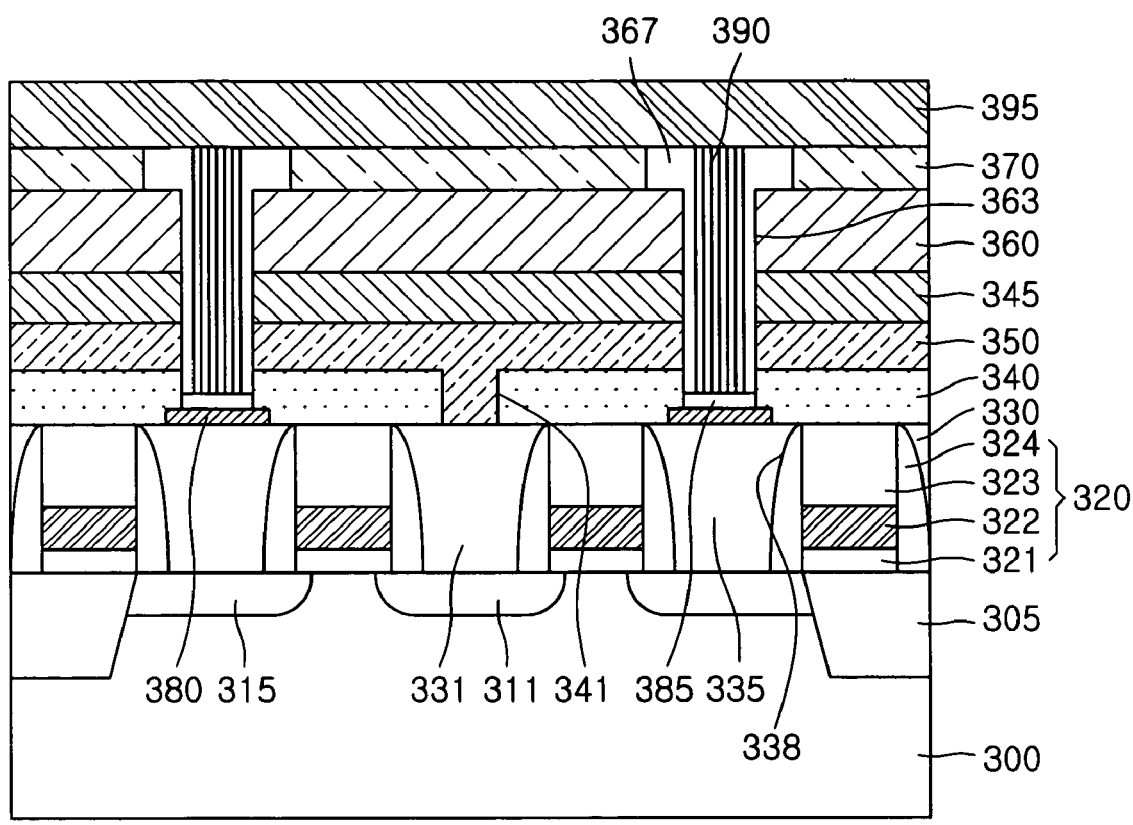
FIG. 7 is a cross section illustrating semiconductor memory devices using an electromechanism of a carbon nano tube according to still further embodiments of the present invention.

FIG. 7 is a cross section illustrating semiconductor memory devices using an electromechanism of a carbon nano tube according to some embodiments of the present invention will be discussed. Referring now to FIG. 7, a device isolation layer 305 is formed to define an active region on a semiconductor substrate 300. A gate stack layer 320 is formed on the active region of the semiconductor substrate 300. The gate stack layer 320 includes a gate insulating layer 321, a gate electrode 322, a capping layer 323, and gate spacers 324. Impurity regions 311 and 315 for source and drain are formed in the active region. A first insulating layer 330 with first contact holes 338 is formed. The first contact holes 338 expose the impurity regions 311 and 315. Contact plugs 331 and 335 contacting with the impurity regions 311 and 315 are formed in the first contact holes 338.

A first electrode layer 380 is formed on the contact plug 335. The first electrode layer 380 includes at least one metal layer including W, Ti, Ta, TiN, TaN, Al, and/or Cu, or includes a doped polysilicon layer. A second insulating layer 340 with second contact holes 341 is formed. The second contact holes 341 expose the contact plug 331. A bit line 350 connected to the contact plug 331 through the second contact hole 341 is formed on the second insulating layer 340. A third insulating layer 345 and a fourth insulating layer 360 are formed on the resulting structure. A third contact hole 363, exposing the first electrode layer 380, is formed on the second, third and fourth insulating layers 340, 345 and 360. A second electrode layer 370 is formed on the fourth insulating layer 360, while maintaining a constant gap from the third contact hole 363. A catalyst layer 385 is formed within the third contact hole 363, and carbon nano tubes 390 are grown on the catalyst layer 385 in a vertical direction with respect to the surface of the substrate. The carbon nano tubes 390 are electrically separated from the second electrode layer 370 by the air gap 367. A fifth insulating layer 395 is formed on the carbon nano tubes 390 and the second electrode layer 370.

The catalyst layer 385 may include one or more transition metal layers including Ni, Fe, and/or Co, or may include one or more silicide layers of transition metals selected from the group consisting of Ni, Fe, and Co. Furthermore, the catalyst layer 385 can include a stacked layer of a low resistance metal layer and a transition metal layer. The low resistance metal layer may include one or more of W, Ti, Ta, Cu, Al, TiN, and/or TaN, and the transition metal layer includes one or more of Ni, Fe, and/or Co. The second electrode layer 360 includes at least one metal layer, such as W, Ti, TiN, Ta, TaN, Cu, Al, Pt, Pd, and/or Au. The second conductive layer 360 can be formed by, for example, spin-coating or dipping compounds containing carbon nano tubes.

Operations of semiconductor memory devices illustrated in FIG. 7 according to some embodiments of the present invention will be discussed. In a data program operation, when a gate driving signal is applied to the gate electrode 322 through a word line (not shown), a transistor starts to operate. When an external data signal of a voltage level is supplied to the bit line 350 and a voltage is applied to the second electrode layer 370, the carbon nano tubes 390 are electrically connected to or disconnected from the second electrode layer 370 by electrical attraction or repulse force according to a voltage difference between the bit line 350 and the second electrode layer 370. Accordingly, the data signal supplied through the bit line 350 is programmed. In a data read operation, the transistor is turned on in response to a predetermined gate voltage applied to the gate electrode 322. When the carbon nano tubes 390 are connected to the second electrode layer 370, a resistance decreases. When the carbon nano tubes 390 are disconnected from the second electrode layer 370, a resistance increases. Therefore, the programmed data is read according to the connection or disconnection between the second electrode layer 370 and the carbon nano tubes 390.

Figure 8A:
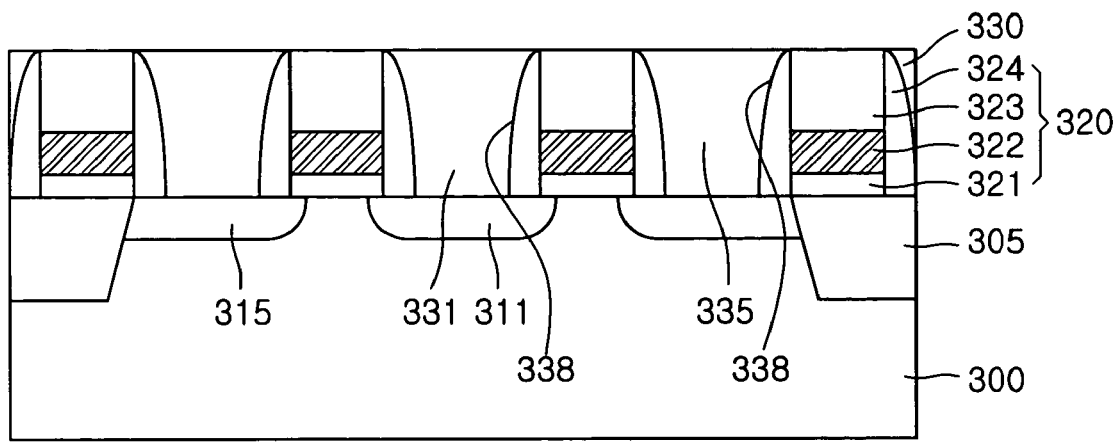
FIGS. 8A through 8E are cross sections illustrating processing steps in the fabrication of semiconductor memory devices according to some embodiments of the present invention.

Referring now to FIGS. 8A through 8E, processing steps in the fabrication of semiconductor memory devices illustrated in FIG. 7 will be discussed. Referring now to FIG. 8A, device isolation layers 305 defining an active region are formed within a semiconductor substrate 300 by a device isolation process. A gate stack layer 320 is formed on the substrate 300. The gate stack layer 320 includes a gate insulating layer 321, a gate electrode 322, a capping layer 323, and gate spacers 324. Impurity regions 311 and 315 for source and drain are formed within the active region by an ion implantation process. A first insulating layer 330 is formed and etched to form first contact holes 338 exposing the impurity regions 311 and 315. A conductive layer is deposited and etched back to form contact plugs 331 and 335 contacting with the impurity regions 311 and 315.

Figure 8B:
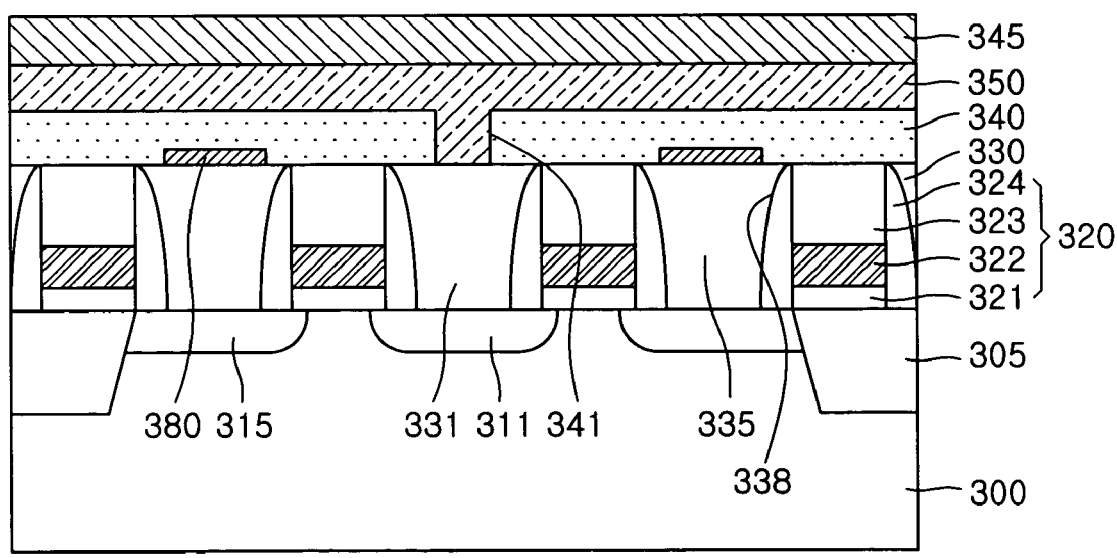

Referring now to FIG. 8B, a first electrode layer 380 is formed on the contact plug 335. A second insulating layer 340 is deposited and etched by, for example, a photolithography process to form a second contact hole 341 that at least partially exposes the contact plug 331. A conductive layer (not shown) is deposited and patterned to form a bit line 350 that contacts the contact plug 331 through the second contact hole 341. A third insulating layer 345 is deposited on the bit line 350.

Figure 8C:
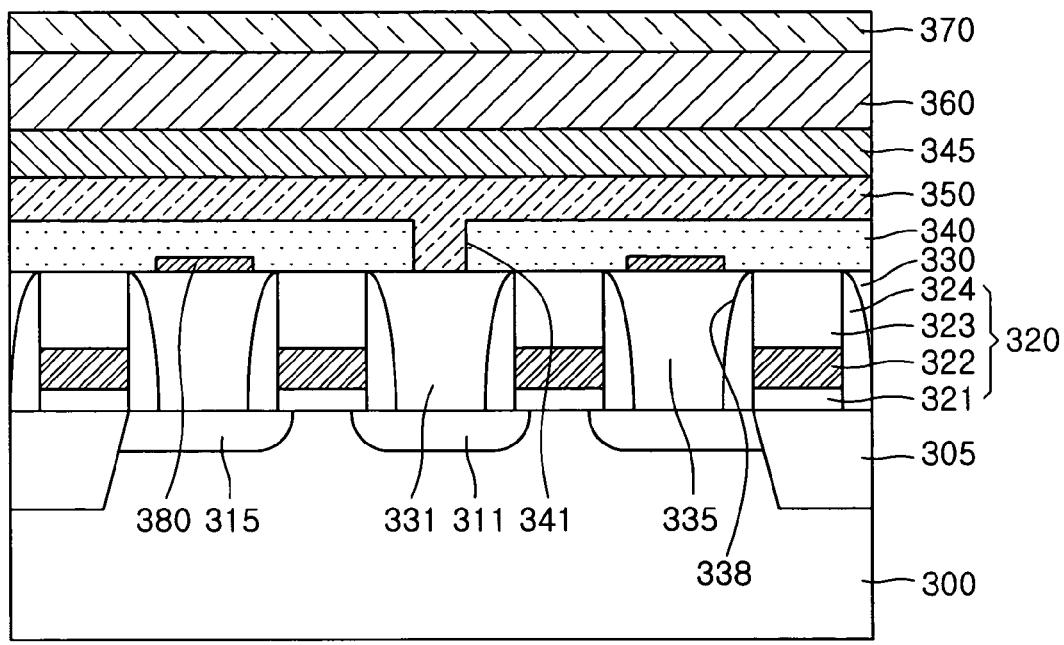

Referring now to FIG. 8C, a fourth insulating layer 360 is formed on the third insulating layer 345 and a second electrode layer 370 is formed on the fourth insulating layer 360. In some embodiments of the present invention, the fourth insulating layer 360 may be formed on the bit line 350 without forming the third insulating layer 345. Furthermore, an etch stop layer may also be formed under the fourth insulating layer 360.

Figure 8D:
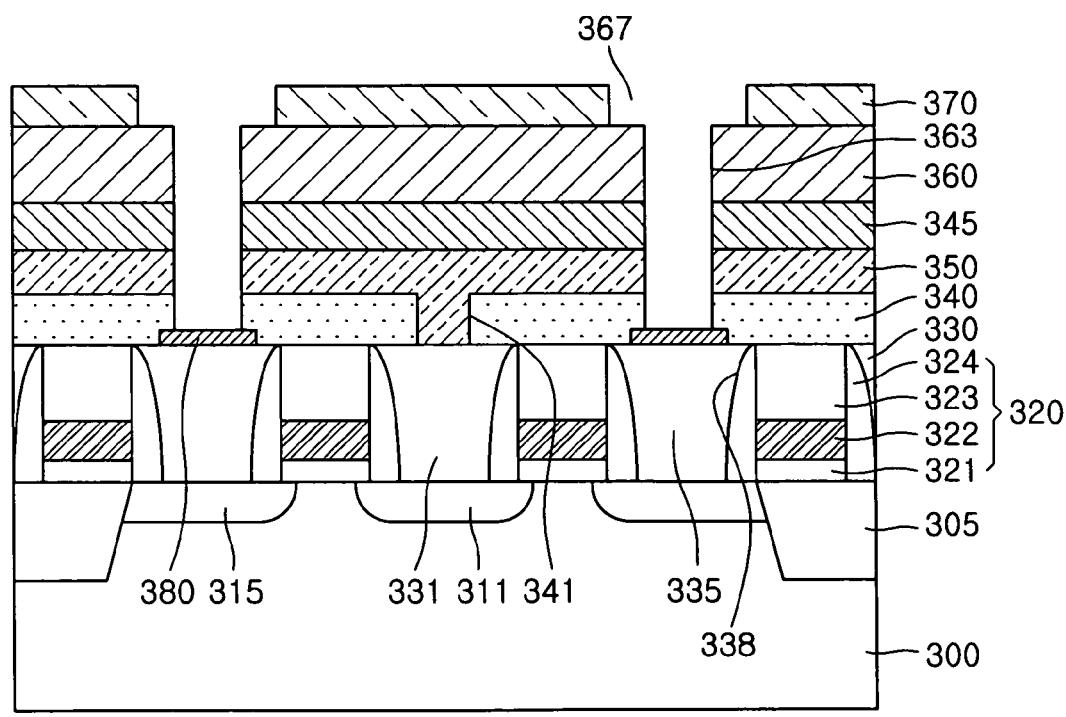

Referring now to FIG. 8D, the second electrode layer 370 and the second through the fourth insulating layers 340, 345, and 360 are etched using, for example, an anisotropic etching process, thereby forming a third contact hole 363. A portion of the second electrode layer 370 may be isotropically etched, thereby forming an air gap 367 maintaining a constant gap from an edge of the third contact hole 363.

Figure 8E:
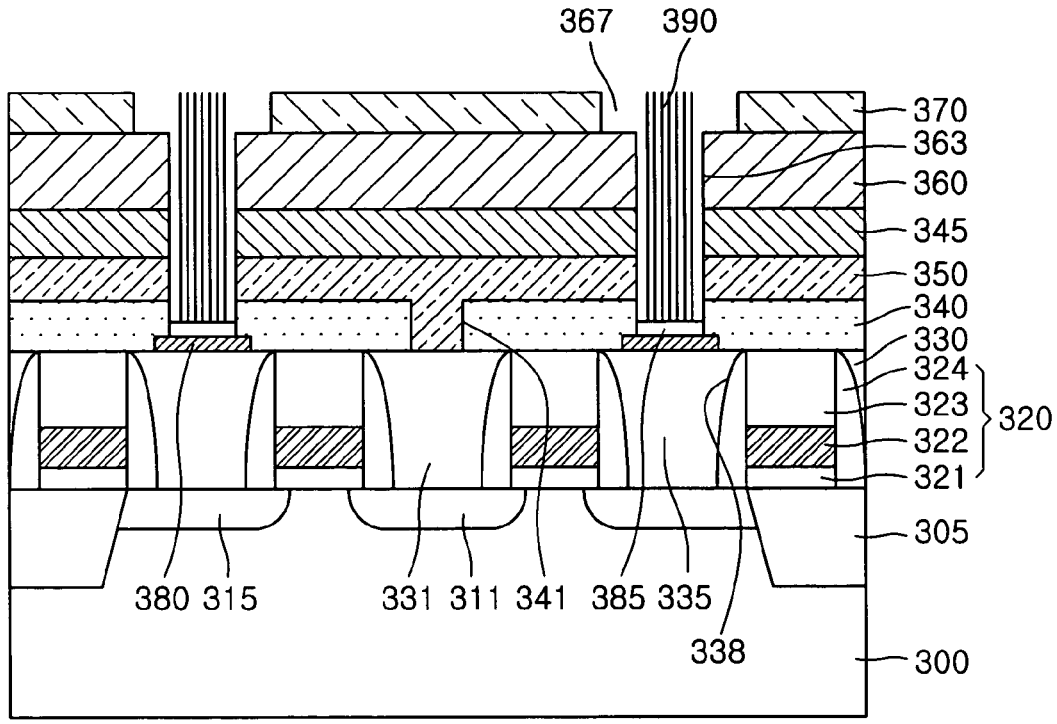

Referring now to FIG. 8E, a catalyst layer 385 is formed within the third contact hole 363, and carbon nano tubes 390 are grown on the catalyst layer 385 in a vertical direction with respect to the semiconductor substrate 300. The catalyst layer 385 can be formed during the formation of the first electrode layer 380. After the forming of the carbon nano tubes 390, the air gap 367 may be formed. A fifth insulating layer (395 of FIG. 7) is formed on the carbon nano tubes 390 and the second electrode layer 370.

Figure 9:
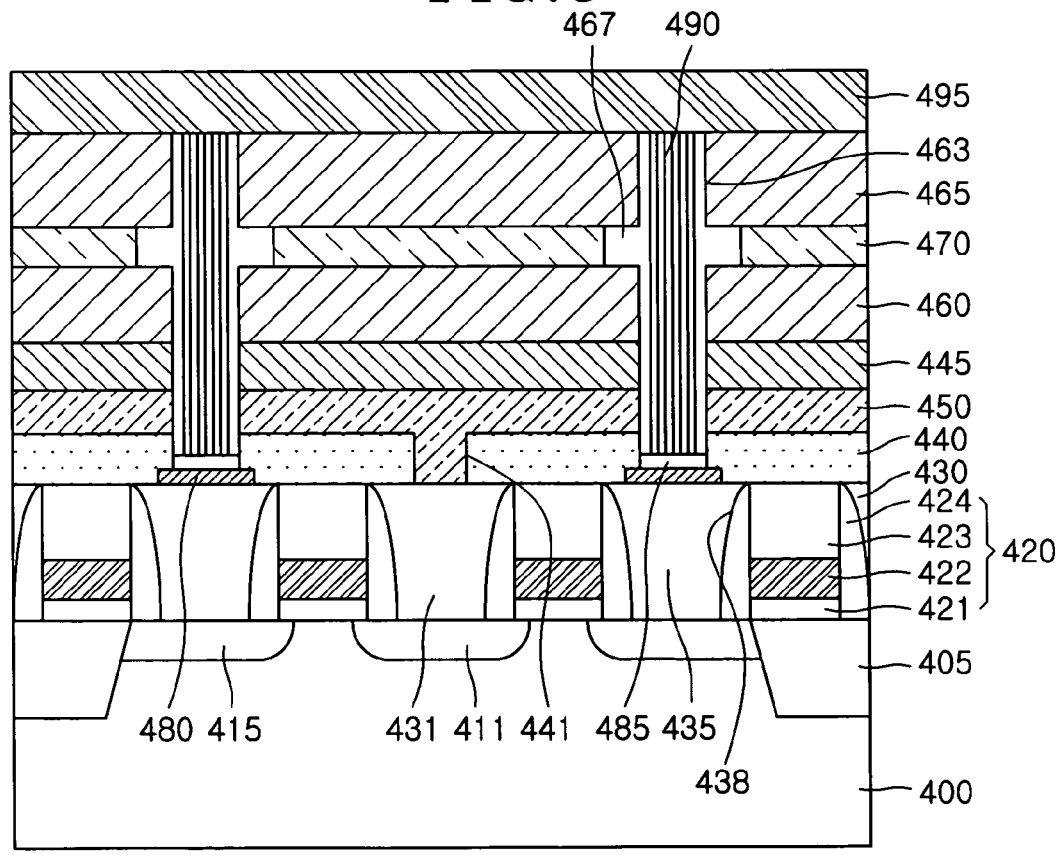
FIG. 9 is a cross section illustrating semiconductor memory devices using an electromechanism of a carbon nano tube according to some embodiments of the present invention.

FIG. 9 is a cross section illustrating semiconductor memory devices using an electromechanism of a carbon nano tube according to some embodiments of the present invention. FIGS. 10A through 10E are cross sections illustrating processing steps in the fabrication of semiconductor memory device illustrated in FIG. 9 according to some embodiments of the present invention. Processing steps in the fabrication of semiconductor memory devices are similar to those discussed above with respect to FIGS. 8A through 8E, except that the electrode layer 470 is formed between the insulating layers 460 and 465. Thus, in the interest of brevity, details with respect to the processing steps of FIGS. 10A through 10C will not be repeated herein.

Figure 10A:
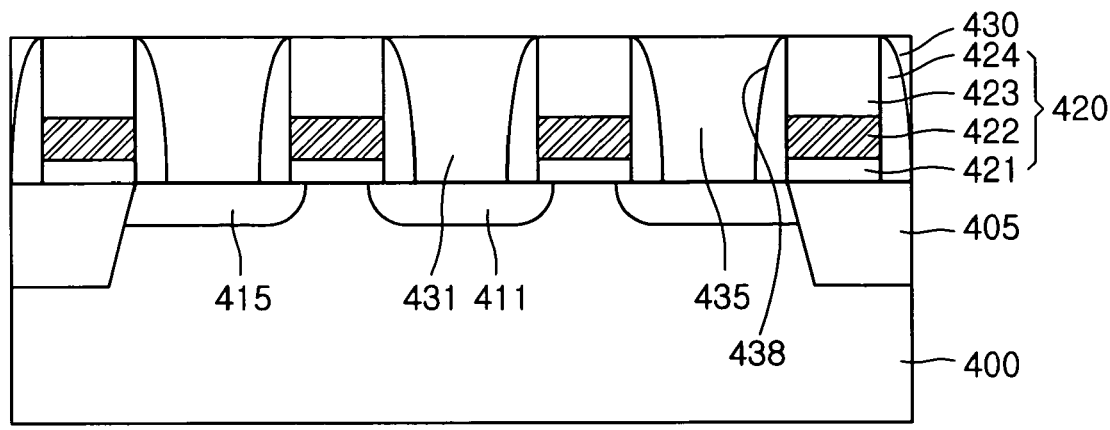
FIGS. 10A through 10E are cross sections illustrating processing steps in the fabrication of semiconductor memory devices according to some embodiments of the present invention.
Figure 10B:
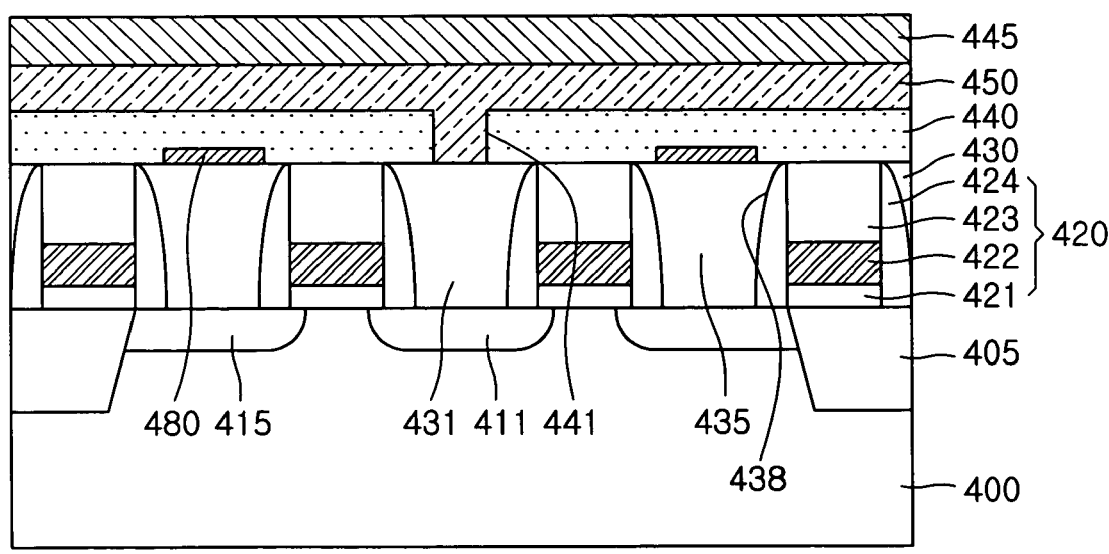
Figure 10C:
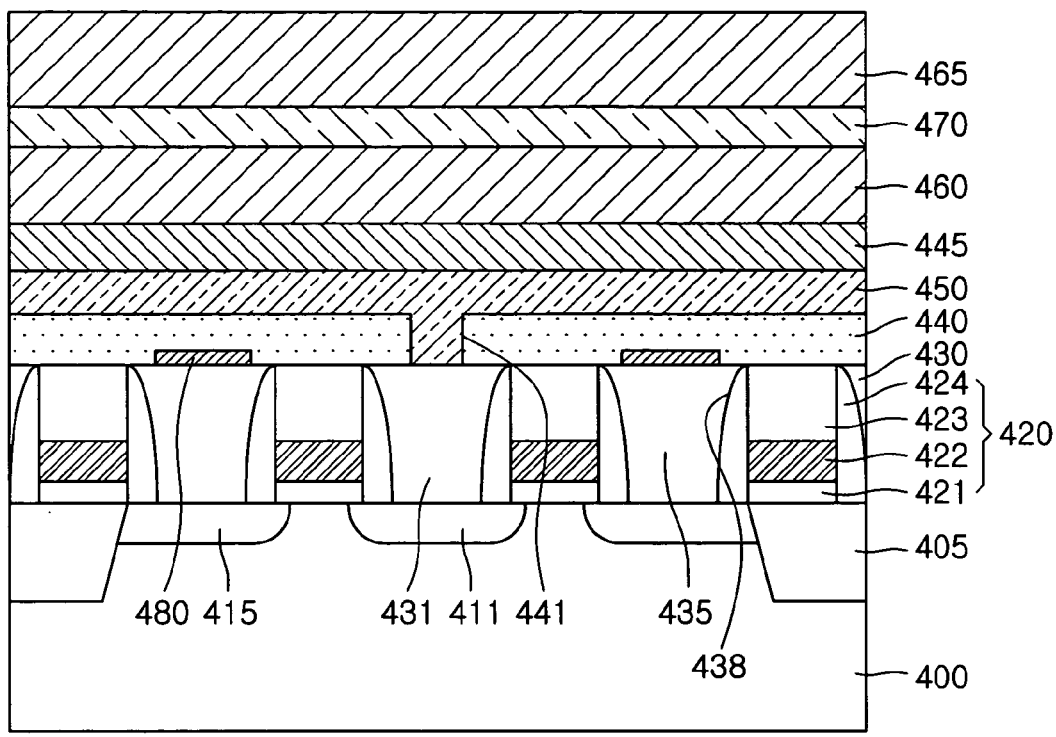
Figure 10D:
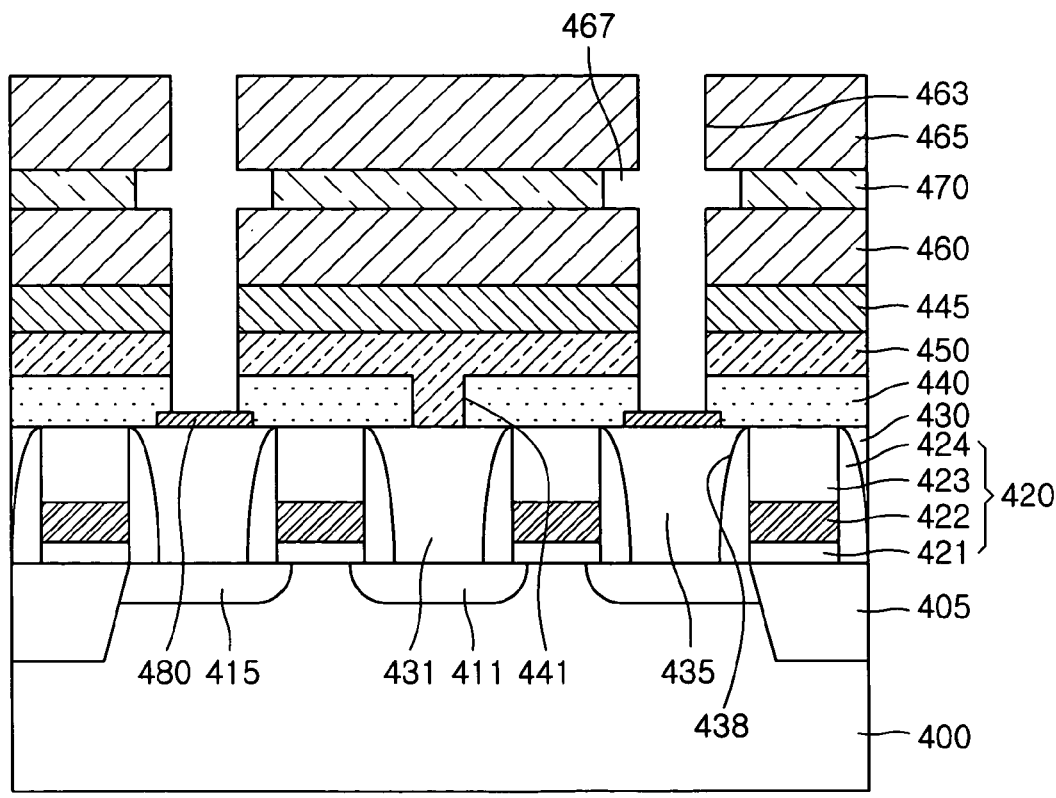
Figure 10E:
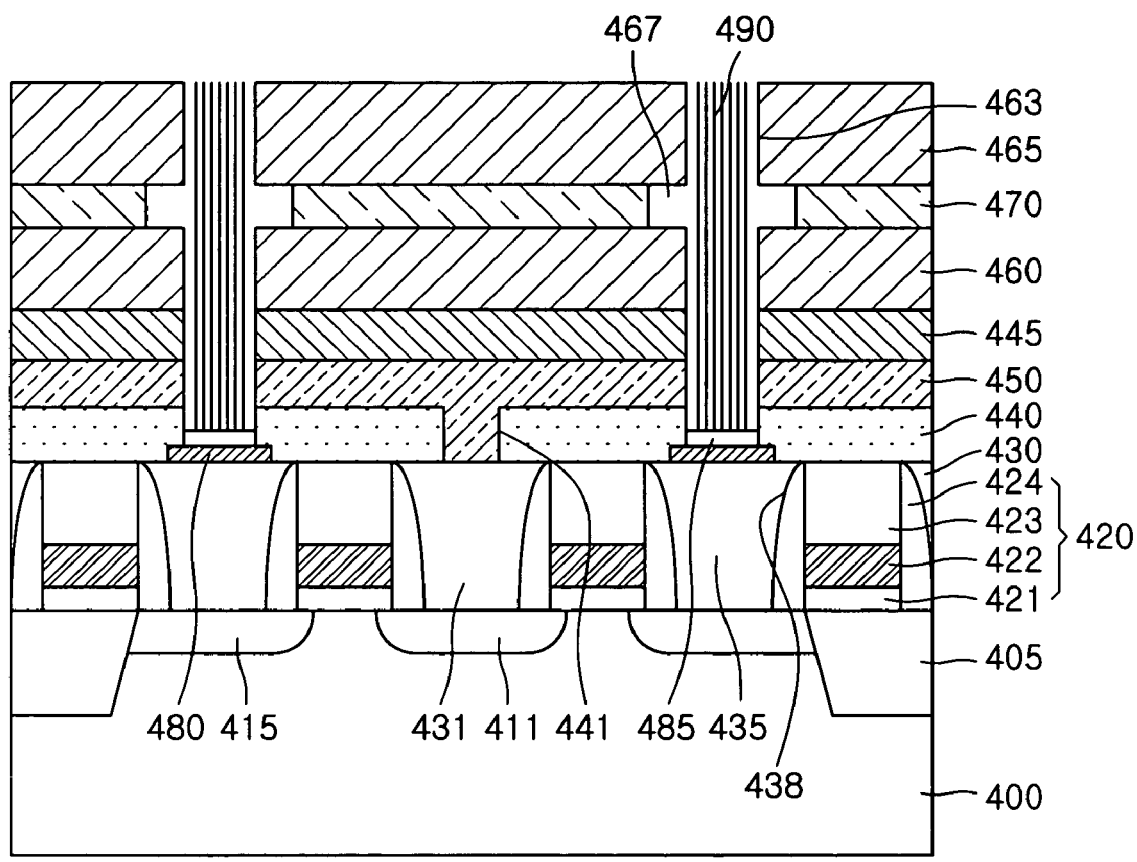

Referring now to FIGS. 9 and 10A through 10E, the catalyst layer 485 is formed on the contact plug 435 without forming the first electrode layer 480 (FIG. 10D). The carbon nano tube 490 is vertically grown on the catalyst layer 485 (FIG. 10E). In some embodiments of the present invention, the first conductive layer 480 and the catalyst layer 485 may be formed on the impurity region 415 without forming the contact plug 435 on the first contact hole 438. In these embodiments of the present invention, the carbon nano tube 490 that is vertically grown on the catalyst layer 485 can be formed over the first contact hole 438 and the third contact hole 463. It will be understood that semiconductor memory devices using the carbon nano tube according to some embodiments of the present invention are not limited to the DRAM structures, but can be applied to various DRAM structures without departing from the scope of the present invention.

Figure 11A:
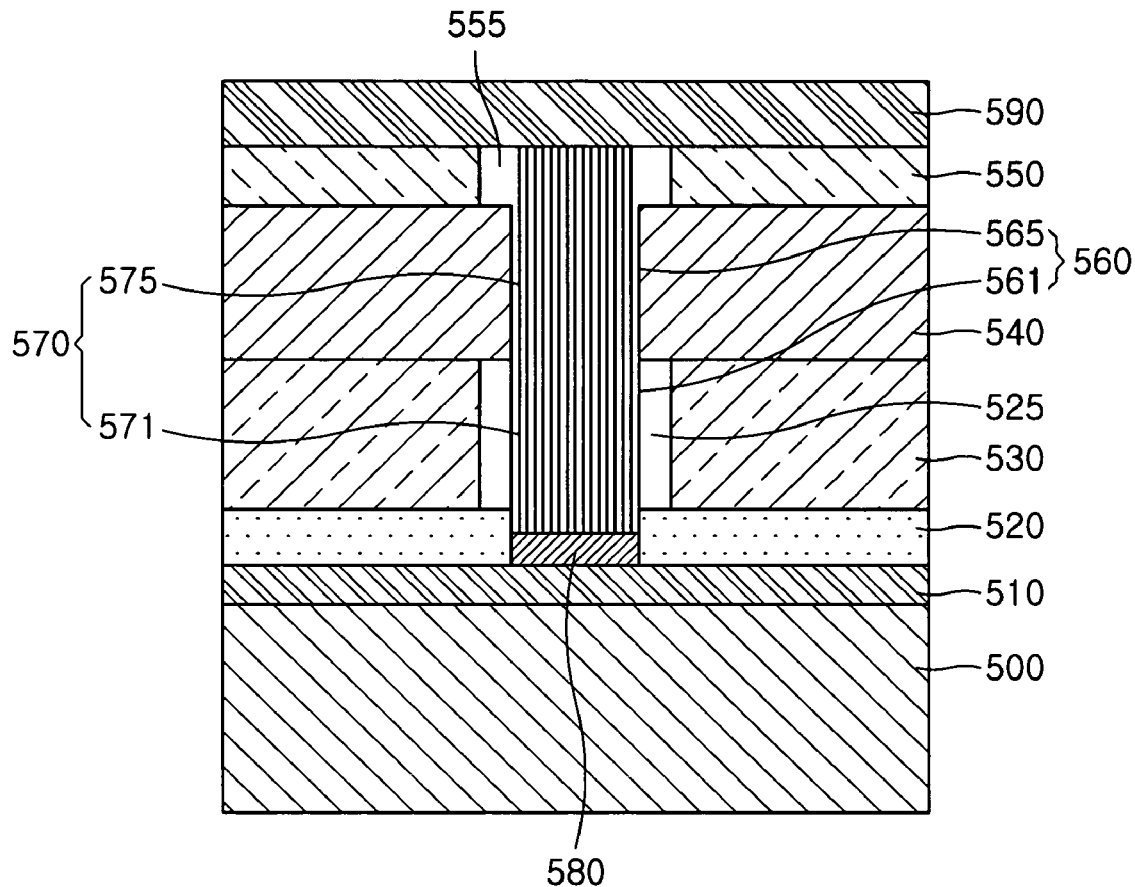
FIG. 11A is a cross section illustrating semiconductor memory devices using an electromechanism of a carbon nano tube according to further embodiments of the present invention.
Figure 11B:
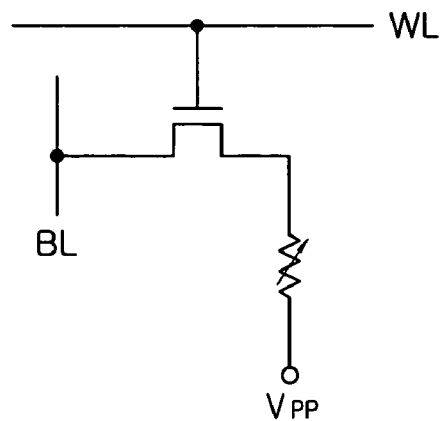
FIG. 11B is an equivalent circuit diagram of semiconductor memory devices illustrated in FIG. 11A according to some embodiments of the present invention.

FIG. 11A is a cross section illustrating semiconductor memory devices using an electromechanism of a carbon nano tube according to further embodiments of the present invention and FIG. 11B is an equivalent circuit diagram of the semiconductor memory devices illustrated in FIG. 11A. Referring now to FIGS. 11A and 11B, a source electrode layer (or a drain electrode layer) 510 is formed on a semiconductor substrate 500. First and second insulating layers 520 and 540 that define a contact hole 560 are sequentially formed on the source electrode layer 510. The contact hole 560 exposes at least a portion of the source electrode layer 510. A catalyst layer 580 is formed on the source electrode layer 510 in the contact hole 560. Carbon nano tubes 570 are grown on the catalyst layer 580 within the contact hole 560 in a vertical direction with respect to the semiconductor substrate 500. Although not illustrated in FIGS. 11A and 1B, an etch stop layer can be further formed between the source electrode layer 510 and the first insulating layer 520. The source electrode layer 510 may include one or more metal layers selected from the group consisting of W, Ti, Ta, TiN, TaN, Al, and Cu, or a doped polysilicon layer. The catalyst layer 580 may include one or more transition metal layers selected from the group consisting of Ni, Fe, and Co, or include a silicide layer of transition metal selected from the group consisting of Ni, Fe, and Co. Furthermore, in some embodiments of the present invention, the catalyst layer 580 may include a stacked layer of a low resistance metal layer and a transition metal layer. The low resistance metal layer may be selected from the group consisting of W, Ti, Ta, Cu, Al, TiN, and TaN, and the transition metal layer may be selected from the group consisting of Ni, Fe, or Co.

A gate electrode 530 is formed between the first insulating layer 520 and the second insulating layer 540, such that the gate electrode 530 is formed on the first insulating layer 520 on both sides of the carbon nano tubes 570 within the contact hole 560. Although the gate electrode 530 is formed on both sides of the carbon nano tubes 570, it can also surround the carbon nano tubes 570. A gate insulating layer 525 is formed between the gate electrode 530 and the carbon nano tubes 570. The gate insulating layer 525 insulates the gate electrode 530 from the carbon nano tubes 570. The gate insulating layer 525 can also be formed on both sides of the carbon nano tubes 570, or can be formed to surround the carbon nano tubes 570. In some embodiments of the present invention, instead of the gate insulating layer 525, an air gap can be formed for the insulation between the gate electrode 530 and the carbon nano tubes 570.

On the second insulating layer 540, an electrode layer 550 is formed spaced apart from an edge of the contact hole 560. Thus, an air gap 555 is formed to insulate the carbon nano tubes 570 from the electrode layer 550. The air gap 555 maintains a predetermined gap of from about several nanometers to about several tens of nanometers from the edge of the contact hole 560. The electrode layer 550 may include one or more metal layers selected from the group consisting of W, Ti, TiN, Ta, TaN, Cu, Al, Pt, Pd, and Au. The electrode layer 550 can be formed by, for example, spin-coating or dipping compounds containing carbon nano tubes. A third insulating layer 590 may be formed on the electrode layer 550 and the carbon nano tubes 570.

In some embodiments, the contact hole 560 includes a first contact hole 561 for defining a channel region, and a second contact hole 565 for defining a switch region. Of the carbon nano tubes 570, a lower portion 571 formed in the first contact hole 561 corresponding to the gate electrode 530 may have a semiconductor characteristic because it is associated with a channel operation, and an upper portion 575 formed in the second contact hole 565 may maintains a switched-on or switched-off state using electric attraction because it is associated with a switching operation. Therefore, when the carbon nano tubes 570 are grown, a diameter of the lower portion 571 can be different from that of the upper portion 575. For example, the lower portion 571 may be vertically grown to from about 1.0 to about 3.0 nm in diameter, while the upper portion 575 may be vertically grown from about 1.0 to about 50.0 nm in diameter.

Operations of the semiconductor memory device according to some embodiments of the present invention will be discussed. In a data program operation, when a gate driving signal is applied to the gate electrode 530 through a word line (WL in FIG. 11B), the lower portion 571 of the carbon nano tubes 570 corresponding to the gate electrode 530 may be in a conductive state. When a data signal is applied to the source electrode layer 510 through a bit line (BL in FIG. 11B) and a program voltage (Vpp) is applied to the electrode layer 550, the upper portion 575 of the carbon nano tubes 570 may be electrically connected to or disconnected from the electrode layer 550 by electrical attraction or repulse force according to a voltage difference between the source electrode layer 510 and the electrode layer 550. In this manner, the data is programmed.

In a data read operation, when a gate driving signal is applied to the gate electrode 530 through the word line WL, the lower portion 571 of the carbon nano tubes 570 corresponding to the gate electrode 530 may be in a conductive state. Since a signal according to the connection state between the upper portion 575 and the electrode layer 550 is transferred from the source electrode layer 510 to the bit line BL, the programmed data can be read.

In a data erase operation, when a gate driving signal is applied to the gate electrode 530 through the word line WL, the lower portion 571 of the carbon nano tubes 570 corresponding to the gate electrode 530 becomes a conductive state. When a predetermined erase voltage is applied to the electrode layer 550, the connection state between the upper portion 575 and the electrode layer 550 is restored to the initial state. Therefore, the programmed data is erased.

Figure 11C:
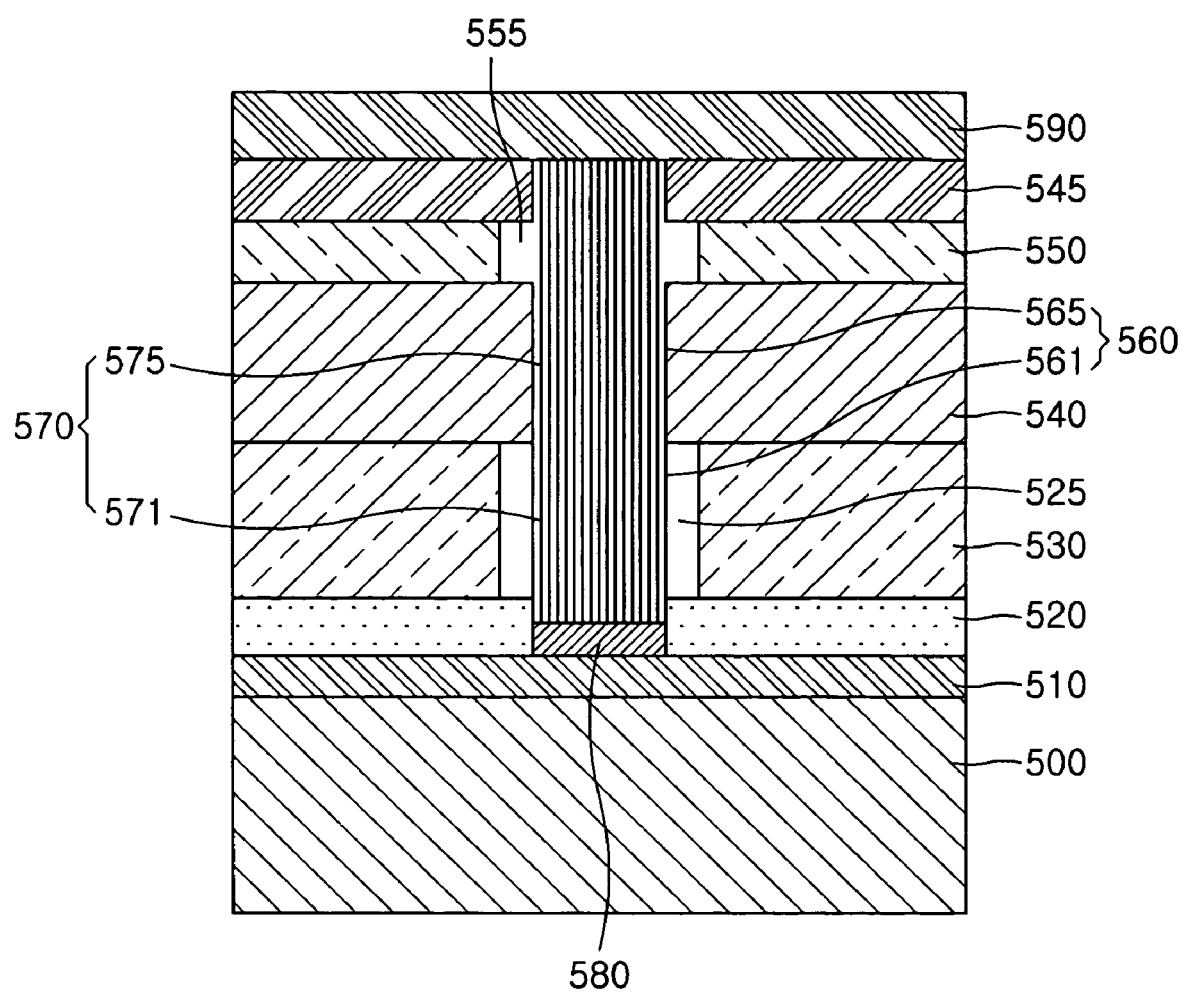
FIG. 11C is a cross section illustrating semiconductor memory devices using an electromechanism of a carbon nano tube according to some embodiments of the present invention.

Referring now to FIG. 11C, a cross section illustrating semiconductor memory devices using an electromechanism of a carbon nano tube according to still further embodiments of the present invention will be discussed. The semiconductor memory device illustrated in FIG. 11C is similar to the semiconductor memory device illustrated in FIG. 11A, except that the electrode layer 550 is formed between the insulating layers 540 and 545. Therefore, a detailed description about the structure and driving method of the semiconductor memory device illustrated in FIG. 11C will be omitted for brevity. Furthermore, the processing steps in the fabrication of the semiconductor memory devices illustrated in FIGS. 11A and 11C are similar to those discussed above with respect to 8A through 8E and 10A through 10E, a detailed description thereof will also be omitted for conciseness.

Figure 12A:
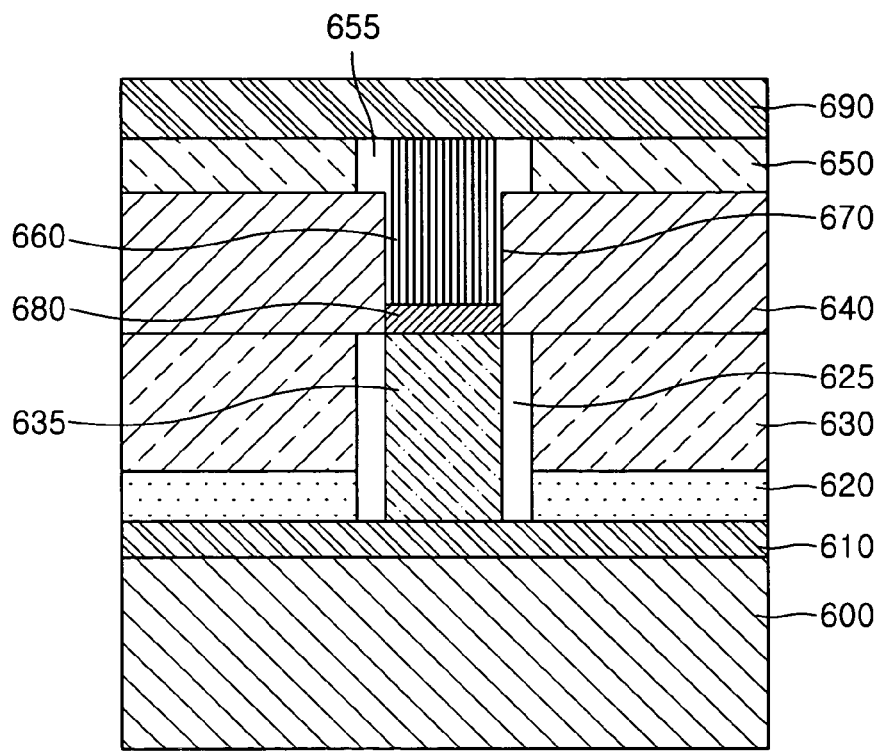
FIG. 12A is a cross section illustrating semiconductor memory devices using an electromechanism of a carbon nano tube according to further embodiments of the present invention.

Referring now to FIG. 12A, a cross section of semiconductor memory devices using an electromechanism of a carbon nano tube according to some embodiments of the present invention. As illustrated in FIG. 12A, a source electrode layer (or a drain electrode layer) 610 is formed on a semiconductor substrate 600. A semiconductor layer 635 acting as a channel layer is formed on the source electrode layer 610. A gate electrode 630 is formed on both sides of the semiconductor layer 635, and a first insulating layer 620 is formed between the gate electrode 630 and the source electrode layer 610. Although the gate electrode 630 is formed on both sides of the semiconductor layer 630, it can also be formed to surround the semiconductor layer 630. A gate insulating layer 625 is formed between the gate electrode 630 and the semiconductor layer 635. The gate insulating layer 625 insulates the gate electrode 630 from the semiconductor layer 635. The gate insulating layer 625 can also be formed on both sides of the carbon nano tubes, or can be formed to surround the carbon nano tubes. The source electrode layer 610 may include one or more metal layers selected from the group consisting of W, Ti, Ta, TiN, TaN, Al, and Cu, or a doped polysilicon layer.

A second insulating layer 640 is formed on the gate electrode 630 and gate insulating layer 625. The second insulating layer 640 includes a contact hole 670 exposing a portion of the semiconductor layer 635. A catalyst layer 680 is formed on the semiconductor layer 635 within the contact hole 670 and carbon nano tubes 660 are grown on the catalyst layer 680 in a vertical direction with respect to the surface of the semiconductor substrate 600. A third insulating layer 690 is formed on the electrode layer 650 and the carbon nano tubes 660. Although not illustrated in FIG. 12A, an etch stop layer can be further formed between the source electrode layer 610 and the first insulating layer 620. The catalyst layer 680 may include one or more transition metal layers selected from the group consisting of Ni, Fe, and Co, or a silicide layer of transition metal selected from the group consisting of Ni, Fe, and Co. In addition, the catalyst layer 680 may include a stacked layer of a low resistance metal layer and a transition metal layer. The low resistance metal layer may be selected from the group consisting of W, Ti, Ta, Cu, Al, TiN, and TaN, and the transition metal layer is selected from Ni, Fe, or Co.

On the second insulating layer 640, an electrode layer 650 is formed spaced apart from an edge of the contact hole 670. Thus, an air gap 655 is formed to insulate the carbon nano tubes 660 from the electrode layer 650. The air gap 655 maintains a gap of from about several nanometers to several about several tens of nanometers from the edge of the contact hole 670. The electrode layer 650 includes one or more metal layers selected from the group consisting of W, Ti, TiN, Ta, TaN, Cu, Al, Pt, Pd, and Au. The electrode layer 650 may be formed by, for example, spin-coating or dipping compounds containing carbon nano tubes.

Operations of semiconductor memory devices according to some embodiments of the present invention will be discussed. In a data program operation, when a gate driving signal is applied to the gate electrode 630 through a word line (WL in FIG. 11B), the semiconductor layer 635 corresponding to the gate electrode 630 may be in a conductive state, so that a channel region is formed. When a data signal of a predetermined voltage level is applied to the source electrode layer 610 through a bit line (BL in FIG. 11B) and a predetermined program voltage (Vpp) is applied to the electrode layer 650, the carbon nano tubes 660 are electrically connected to or disconnected from the electrode layer 650 by electrical attraction or repulse force according to a voltage difference between the source electrode layer 610 and the electrode layer 650. In this manner, the data is programmed.

In a data read operation, when a gate driving signal is applied to the gate electrode 630 through the word line WL, the semiconductor layer 635 may be in a conductive state. Since a signal according to the connection state between the carbon nano tubes 660 and the electrode layer 650 is transferred from the source electrode layer 610 to the bit line BL, the programmed data can be read.

In a data erase operation, when a gate driving signal is applied to the gate electrode 630 through the word line WL, the semiconductor layer 635 may be in a conductive state, so that a channel layer is formed. When a predetermined erase voltage is applied to the source electrode 610 and the electrode layer 650, the connection state between the carbon nano tubes 660 and the electrode layer 650 is restored to the initial state. Therefore, the programmed data is erased.

Figure 12B:
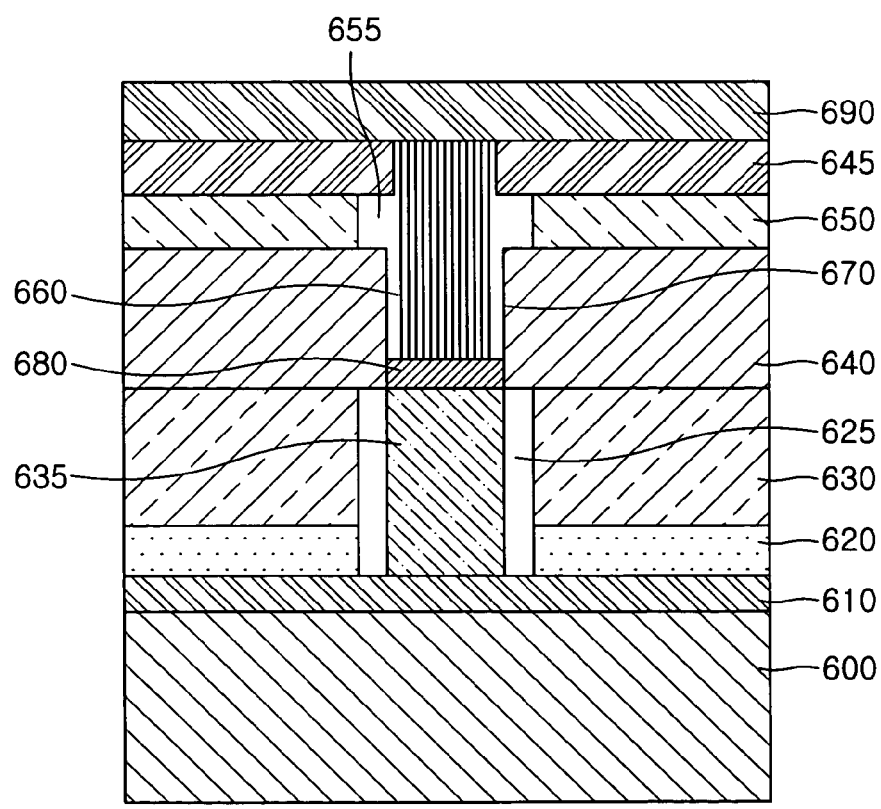
FIG. 12B is a cross section of semiconductor memory devices using an electromechanism of a carbon nano tube according to still further embodiments of the present invention.

Referring now to FIG. 12B, a cross section illustrating semiconductor memory devices using an electromechanism of a carbon nano tube according to further embodiments of the present invention will be discussed. The semiconductor memory device illustrated in FIG. 12B is similar to the semiconductor memory device illustrated in FIG. 12A, except that the electrode layer 650 is formed between the insulating layers 640 and 645. Methods of fabricating the semiconductor memory devices illustrated in FIGS. 12A and 12B are similar to those of the semiconductor memory devices discussed above, a detailed description thereof will be omitted for conciseness.

It will be understood that semiconductor memory devices using the electromechanism of the carbon nano tubes are not limited to the structure of the nonvolatile memory devices as discussed herein, but can be applied to different kinds of nonvolatile memory devices without departing from the scope of the present invention.

As described above, since the nano semiconductor switch device may be implemented using the electromechanism of the carbon nano tubes according to some embodiments of the present invention, a switch device may be provided having both high speed operation and low power consumption. Furthermore, by implementing semiconductor memory devices using the electromechanism of the carbon nano tubes, the degree of integration may be further increased and the low power consumption and high speed operation may be obtained. Moreover, the switching characteristic of the carbon nano tubes can be applied to DRAM, nonvolatile memory device, static random access memory (SRAM), ferroelectric random access memory (FRAM), phase-change random access memory (PRAM), magnetic random access memory (MRAM), embedded memory and the like without departing from the scope of the present invention In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A nano semiconductor switch device comprising:
   a semiconductor substrate;
   a first conductive layer on the semiconductor substrate;
   a second conductive layer on the first conductive layer;
   a first insulating layer on the second conductive layer and the semiconductor substrate, the first insulating layer defining a contact hole that exposes at least a portion of the second conductive layer;
   a third conductive layer on the first insulating layer, the third conductive layer having an air gap configured such that a side of the third conductive layer is outwardly spaced apart from the contact hole; and
   carbon nano tubes on the exposed portion of the second conductive layer in the contact hole, the carbon nano tubes being substantially extended from an upper surface of the third conductive layer in a vertical direction with respect to the semiconductor substrate, wherein the air gap electrically separates the carbon nano tubes from the side of the third conductive layer.

2. The device of claim 1, wherein the first conductive layer comprises at least one metal selected from the group consisting of tungsten (W), titanium (Ti), tantalum (Ta), titanium nitride (TiN), tantalum nitride (TaN), aluminum (Al), and copper (Cu).

3. The device of claim 1, wherein the second conductive layer comprises at least one transition metal selected from the group consisting of nickel (Ni), iron (Fe), and cobalt (Co), or a suicide layer of a transition metal selected from the group consisting of Ni, Fe, and Co.

4. The device of claim 1, wherein the second conductive layer comprises a stacked layer of a low resistance metal layer and a transition metal layer, wherein the low resistance metal layer comprises at least one low resistance metal selected from the group consisting of W, Cu, Al, Ti, TiN, Ta, and TaN and wherein the transition metal layer comprises at least one transition metal selected from the group consisting of Ni, Fe, and Co.

5. The device of claim 1, wherein the air gap comprises a gap of from about several nanometers to about several tens of nanometers between the carbon nano tubes and the third conductive layer.

6. The device of claim 1, wherein the third conductive layer comprises at least one metal selected from the group consisting of doped polysilicon, W, Ti, TiN, Ta, TaN, Cu, Al, platinum (Pt), palladium (Pd), and aurum (Au).

7. The device of claim 1, further comprising a second insulating layer on the third conductive layer and the carbon nano tubes in the contact hole so as to protect the carbon nano tubes.

8. The device of claim 7, further comprising a third insulating layer between the third conductive layer and the second insulating layer, the contact hole being formed over the first insulating layer and the third insulating layer.

9. A semiconductor memory device including a carbon nano tube, comprising:
   a semiconductor substrate;
   first and second spaced apart imparity regions on the semiconductor substrate;
   a gate stack layer on the semiconductor substrate between the first and second impurity regions;
   a first insulating layer on the semiconductor substrate, the first insulating layer defining first and second contact holes exposing at least a portion of the first and second impurity regions, respectively;
   a first electrode layer on the first impurity region in the first contact hole exposing the first impurity region;

a second insulating layer on the semiconductor substrate, the second insulating layer including a third contact hole exposing at least a portion of the second impurity region;

an interconnection line on the second insulating layer to contact with the second impurity region through the second contact and third contact holes;

a third insulating layer having a fourth contact hole, the fourth contact hole being formed over the first and second insulating layers to expose at least a portion of the first electrode layer;

a catalyst layer formed on the first electrode layer in the fourth contact hole;

carbon nano tubes on the catalyst layer in the fourth contact hole, the carbon nano tubes being in a vertical direction with respect to the semiconductor substrate; and a second electrode layer on the third insulating layer, the second electrode layer including an air gap configured to electrically separate the carbon nano tubes and the second electrode layer.

10. The device of claim 9, wherein the first conductive layer comprises at least one metal selected from the group consisting of W, Ti, Ta, TiN, TaN, Al, and copper (Cu), and the second conductive layer comprises at least one metal selected from the group consisting of a doped polysilicon layer, W, Ti, TiN, Ta, TaN, Cu, Al, Pt, Pd, and Au.

11. The device of claim 9, wherein the catalyst layer comprises includes at least one transition metal selected from the group consisting of Ni, Fe, and Co, a silicide layer of a transition metal selected from the group consisting of Ni, Fe, and Co, or a stacked layer of a low resistance metal layer and a transition metal layer, wherein the low resistance metal layer comprises at least one metal selected from the group consisting of W, Cu, Al, Ti, TiN, Ta, and TaN and wherein the transition metal layer comprises at least one metal selected from the group consisting of Ni, Fe, and Co.

12. The device of claim 9, wherein the air gap comprises a gap of from about several nanometers to about several tens of nanometers between the carbon nano tubes and the second electrode layer.

13. The device of claim 9, further comprising:
a fourth insulating layer on the second electrode layer and the carbon nano tubes in the fourth contact hole so as to protect the carbon nano tubes; and
a fifth insulating layer between the second electrode layer and the fourth insulating layer, the fourth contact hole being formed over the third insulating layer and the fifth insulating layer.

14. The device of claim 9, further comprising contact plugs between the first impurity region and the first electrode layer, and between the second impurity region and the interconnection line.

15. A semiconductor memory device including a carbon nano tube, comprising:
a semiconductor substrate;
a first electrode layer on the semiconductor substrate;
first and second insulating layers on the semiconductor substrate, the first and second insulating layers defining a contact hole therein that exposed at least a portion of the first electrode layer;
a catalyst layer on the exposed portion of the first electrode layer in the contact hole;
a second electrode layer on the second insulating layer, the second electrode layer including an air gap configured such that a side of the second electrode layer is outwardly spaced apart from the contact hole;
carbon nano tubes on the catalyst layer in the contact hole, the carbon nano tubes being substantially extended from an upper surface of the second electrode layer in a vertical direction with respect to the semiconductor substrate, wherein the air gap electrically separates the carbon nano tubes from the side of the third conductive layer; and
a gate electrode on both sides of the carbon nano tubes between the first insulating layer and the second insulating layer.

16. The device of claim 15, wherein the first electrode layer comprises at least one metal selected from the group consisting of W, Ti, Ta, TiN, TaN, Al, and Cu, and wherein the second electrode layer comprises at least one metal selected from the group consisting of a doped polysilicon layer, W, Ti, TiN, Ta, TaN, Cu, Al, Pt, Pd, and Au.

17. The device of claim 15, wherein the catalyst layer comprises at least one transition metal selected from the group consisting of Ni, Fe, and Co, at least one of silicide layers of transition metals selected from the group consisting of Ni, Fe, and Go, or a stacked layer of a low resistance metal layer and a transition metal layer, wherein the low resistance metal layer comprises at least one metal selected from the group consisting of W, Cu, Al, Ti, TiN, Ta, and TaN and wherein the transition metal layer comprises at least one metal selected from the group consisting of Ni, Fe, and Co.

18. The device of claim 15, wherein the air gap comprises a gap of from about several nanometers to about several tens of nanometers between the carbon nano tubes and the second conductive layer.

19. The device of claim 15, further comprising:
a third insulating layer on the second electrode layer and the carbon nano tubes within the contact hole so as to protect the carbon nano tubes; and
a fourth insulating layer between the second electrode layer and the third insulating layer, the contact hole being formed over the first insulating layer, the third insulating layer, and the fourth insulating layer.

20. The device of claim 15, wherein a portion of the carbon nano tubes corresponding to the gate electrode has a semiconductor characteristic serving as a channel layer.

21. The device of claim 15, further comprising a gate insulating layer between the gate electrode and the carbon nano tubes so as to isolate the gate electrode from the carbon nano tubes.

22. A semiconductor memory device including a carbon nano tube, comprising:
a semiconductor substrate;
a first electrode layer on the semiconductor substrate;
a semiconductor layer on the first electrode layer;
a gate electrode on both sides of the semiconductor layer;
a first insulating layer formed between the gate electrode and the first electrode;
a second insulating layer defining a contact hole therein that exposes at least a portion of the semiconductor layer;
a catalyst layer formed on the exposed portion of the first electrode layer in the contact hole;
carbon nano tubes on the catalyst layer within the contact hole, the carbon nano tubes being in a vertical direction with respect to the semiconductor substrate; and
a second electrode layer on the second insulating layer, the second electrode layer including an air gap that is configured to electrically isolate the carbon nano tubes from the second electrode layer.

23. The device of claim 22, wherein the first electrode layer comprises at least one metal selected from the group consisting of W, Ti, Ta, TiN, TaN, Al, and Cu, and the second electrode layer comprises at least one metal selected from the group consisting of a doped polysilicon layer, W, Ti, TiN, Ta, TaN, Cu, Al, Pt, Pd, and Au.

24. The device of claim 22, wherein the catalyst layer comprises at least one transition metal selected from the group consisting of Ni, Fe, and Co, at least one of silicide layers of transition metals selected from the group consisting of Ni, Fe, and Co, or a stacked layer of a low resistance metal layer and a transition metal layer, wherein the low resistance metal layer comprises at least one metal selected from the group consisting of W, Cu, Al, Ti, TiN, Ta, and TaN and wherein the transition metal layer comprises at least one metal selected from the group consisting of Ni, Fe, and Co.

25. The device of claim 22, wherein the air gap comprises a gap of from about several nanometers to about several tens of nanometers between the carbon nano tubes and the second conductive layer.

26. The device of claim 22, further comprising:
a third insulating layer on the second electrode layer and the carbon nano tubes within the contact hole so as to protect the carbon nano tubes; and
a fourth insulating layer between the second electrode layer and the third insulating layer, the contact hole being formed over the second insulating layer and the fourth insulating layer.

27. The device of claim 22, further comprising a gate insulating layer between the gate electrode and the carbon nano tubes so as to isolate the gate electrode from the carbon nano tubes.

* * * * *